(12) United States Patent
Seo et al.

(10) Patent No.: US 8,217,569 B2
(45) Date of Patent: Jul. 10, 2012

(54) LOW DRIVE VOLTAGE LIGHT EMITTING ELEMENT

(75) Inventors: Satoshi Seo, Kawasaki (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 691 days.

(21) Appl. No.: 11/793,526

(22) PCT Filed: Dec. 26, 2005

(86) PCT No.: PCT/JP2005/024213
§ 371 (c)(1),
(2), (4) Date: Jun. 20, 2007

(87) PCT Pub. No.: WO2006/070913
PCT Pub. Date: Jul. 6, 2006

(65) Prior Publication Data
US 2008/0035916 A1    Feb. 14, 2008

(30) Foreign Application Priority Data

Dec. 28, 2004    (JP) .................................. 2004-381367

(51) Int. Cl.
*H01L 51/50* (2006.01)
*H01L 51/52* (2006.01)
*H01L 51/54* (2006.01)

(52) U.S. Cl. ........ 313/503; 313/504; 313/505; 428/917; 428/690

(58) Field of Classification Search .......... 313/498–512; 428/917, 690–691
See application file for complete search history.

(56) References Cited

U.S. PATENT DOCUMENTS

| | | | |
|---|---|---|---|
| 6,830,830 B2 | 12/2004 | Hsieh et al. | |
| 7,732,808 B2 | 6/2010 | Ikeda et al. | |
| 7,750,560 B2 | 7/2010 | Yamazaki et al. | |
| 2003/0189401 A1* | 10/2003 | Kido et al. | 313/504 |
| 2005/0084712 A1 | 4/2005 | Kido et al. | |
| 2005/0087769 A1* | 4/2005 | Yamazaki et al. | 257/202 |

(Continued)

FOREIGN PATENT DOCUMENTS

EP    1 359 630    11/2003

(Continued)

OTHER PUBLICATIONS

International Search Report (Application No. PCT/JP2005/024213) dated Apr. 25, 2006.

(Continued)

*Primary Examiner* — Anne Hines
*Assistant Examiner* — Jose M Diaz
(74) *Attorney, Agent, or Firm* — Eric J. Robinson; Robinson Intellectual Property Law Office, P.C.

(57) ABSTRACT

An object of the present invention is to provide a material which does not substantially have a hole injection barrier from an electrode. A composite material containing an organic compound and an inorganic compound, in which measured current-voltage characteristics of a thin-film layer formed from the composite material which is sandwiched between a pair of electrodes each having a work function of 3.5 eV to 5.5 eV follow Formula (1) below, is manufactured.

$$J = \left\{ A\exp\left(\frac{-\phi_a}{2kT}\right) \right\} V + BV^n \quad (1)$$

15 Claims, 27 Drawing Sheets

U.S. PATENT DOCUMENTS

| | | | |
|---|---|---|---|
| 2005/0106419 A1 | 5/2005 | Endoh et al. | |
| 2006/0008740 A1 | 1/2006 | Kido et al. | |
| 2006/0194073 A1* | 8/2006 | Okada | 428/690 |
| 2010/0096627 A1 | 4/2010 | Ikeda et al. | |
| 2010/0207518 A1 | 8/2010 | Ikeda et al. | |

FOREIGN PATENT DOCUMENTS

| | | | |
|---|---|---|---|
| EP | 1 524 706 | 4/2005 | |
| EP | 1 531 501 | 5/2005 | |
| EP | 1 617 493 | 1/2006 | |
| EP | 1 351 558 | 7/2006 | |
| JP | 2003-272860 | 9/2003 | |
| JP | 2004-006321 | 1/2004 | |
| JP | 2005-123095 | 5/2005 | |
| JP | 2005-166641 | 6/2005 | |
| JP | 2006-024791 | 1/2006 | |
| WO | WO 2004078722 A1 * | 9/2004 | |

OTHER PUBLICATIONS

Written Opinion (Application No. PCT/JP2005/024213) dated Apr. 25, 2006.

Shirota et al., "Multilayered organic electroluminescent device using a novel starburst molecule, 4,4',4"-tris(3-methylphenylphenylamino)tripheylamine, as a hole transport material" Applied Physics Letters, vol. 65, No. 7, Aug. 15, 1994, pp. 807-809.

Yamamori et al., "Doped organic light emitting diodes having a 650-nm-thick hole transport layer" Applied Physics Letters, vol. 72, No. 17, Apr. 27, 1998, pp. 2147-2149.

* cited by examiner

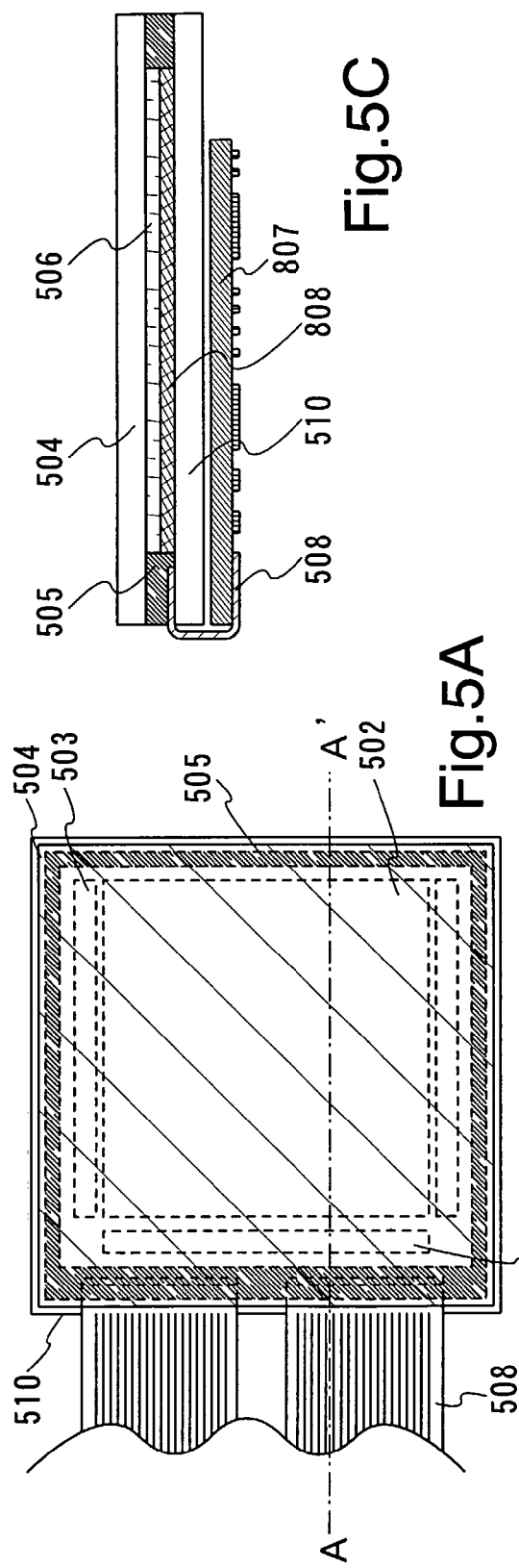
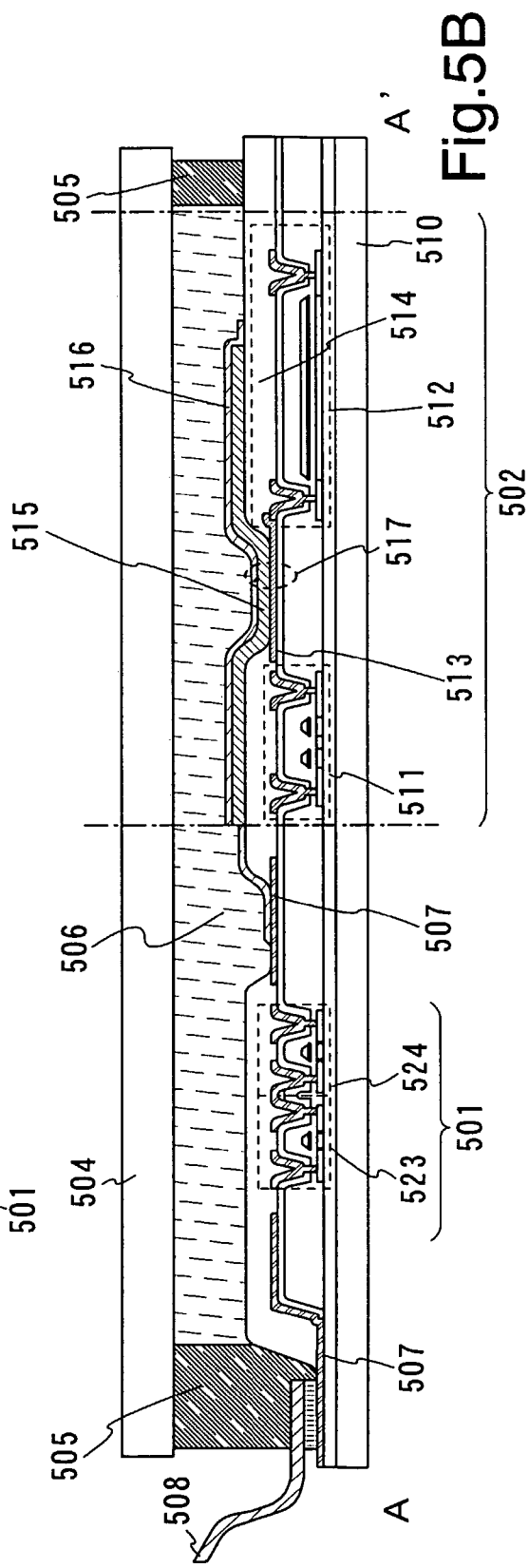

LOW DRIVE VOLTAGE LIGHT EMITTING ELEMENT

TECHNICAL FIELD

The present invention relates to a composite material in which an organic compound is compounded with an inorganic compound and which can form a favorable contact with various kinds of electrodes. The invention also relates to a current-excitation light emitting element in which the composite material is provided in contact with an electrode.

BACKGROUND ART

In recent years, a light emitting element using a light emitting organic compound has been actively researched and developed. A basic structure of this light emitting element is that a layer containing a light emitting organic compound (light emitting layer) is sandwiched between a pair of electrodes. By applying a voltage to this element, electrons and holes are separately transported from the pair of electrodes to the light emitting layer, and current flows. Then, recombination of these carriers (the electrons and holes) makes the light emitting organic compound to form an excited state and to emit light when the excited state returns to a ground state. Owing to such a mechanism, such a light emitting element is referred to as a current-excitation light emitting element.

Note that an excited state of an organic compound includes a singlet excited state and a triplet excited state. Light emission from the singlet excited state is referred to as fluorescence, and light emission from the triplet excited state is referred to as phosphorescence.

A great advantage of such a light emitting element is that the light emitting element can be manufactured to be thin and lightweight, since the light emitting element is generally formed of an approximately submicron thin film. In addition, extremely high response speed is another advantage, since time between carrier injection and light emission is approximately microseconds or less. These characteristics are considered suitable for a flat panel display element.

Such a light emitting element is formed in a film shape. Thus, surface emission can be easily obtained by forming a large-area element. This characteristic is hard to be obtained by a point light source typified by an incandescent lamp or an LED or a line light source typified by a fluorescent lamp. Therefore, the above described light emitting element has high utility value also as a surface light source applicable to lighting or the like.

Thus, the current-excitation light emitting element using the light emitting organic compound is expected to be applied to a light emitting device, lighting, or the like. However, there are still many problems. As one example of the problems, reduction in power consumption is given. It is an important issue to reduce a drive voltage of the light emitting element in order to reduce power consumption. Since emission intensity of the current-excitation light emitting element depends on the amount of current flowing therethrough, it is necessary to conduct a large amount of current at low voltage in order to reduce a drive voltage.

It has been attempted so far to provide a buffer layer in contact with an electrode as a technique for reducing a drive voltage. Specifically, it is known that a drive voltage can be reduced by providing a buffer layer using an aromatic amine compound at an interface with an anode (for example, Reference 1: Y. Shirota et al., Applied Physics Letters, Vol. 65, 807-809 (1994)). The aromatic amine compound used in Reference 1 has a high location of HOMO level and an approximate value to a work function of an electrode material for forming the anode. Therefore, a hole injection barrier can be lowered. Accordingly, a large amount of current can flow at relatively low voltage.

Another method is also reported, in which a layer, conductivity of which is increased by adding electron-accepting molecules to a hole transporting high molecular weight material, is used at an interface with an anode (for example, Reference 2: A. Yamamori et al., Applied Physics Letters, Vol. 72, 2147-2149 (1998)). A drive voltage can also be reduced by using such a structure.

However, there is a problem in that such an organic compound which can lower a hole injection barrier as described in Reference 1 is limited, and heat resistance of the material is generally not high. The same applies to such an electron accepting molecule as described in Reference 2.

Conventionally, even if an organic compound which can lower a hole injection barrier is used, the hole injection barrier cannot be made to disappear substantially, and current-voltage characteristics of the light emitting element are controlled by injection (in other words, current-voltage characteristics in which a Schottky injection mechanism is dominant). Therefore, there is limitation on further reduction in a drive voltage.

Further, when a material which does not have a high work function is used for an anode, a hole injection barrier thereof is more increased. Therefore, there is another limitation in that a material having a high work function needs to be used as an electrode material for forming the anode in order to prevent an increase in drive voltage of the light emitting element. In other words, this leads to a problem in that general-purpose metal such as aluminum, which does not have a high work function, cannot be used for the anode.

DISCLOSURE OF INVENTION

It is an object of the present invention to provide a material which does not substantially have a hole injection barrier from an electrode. It is another object of the invention to provide a material which does not substantially have a hole injection barrier with various electrodes. It is still another object to provide a material having these characteristics and high heat resistance.

In addition, it is also an object to provide a light emitting element and a light emitting device with a low drive voltage by using the material. It is yet another object to provide an inexpensive light emitting element and an inexpensive light emitting device by using a combination of the material and general-purpose metal.

As a result of keen examination, the present inventor has found that the objects can be achieved by providing a composite material, in which an organic compound is compounded with an inorganic compound, in contact with an electrode of a light emitting element. One feature of this composite material is that measured current-voltage characteristics at the time of using an electrode having a work function of 3.5 eV to 5.5 eV are expressed by addition of current showing behavior like an impurity semiconductor (i.e. ohmic current which easily flows when temperature increases) to trap-charge limited current.

It is found that the composite material showing such current-voltage characteristics does not substantially have a hole injection barrier with an electrode having a work function of 3.5 eV to 5.5 eV, which is different from a conventional material formed from only an organic compound. In addition, the composite material also has high heat resistance since an inorganic compound is compounded.

Thus, one structure of the invention is a composite material containing an organic compound and an inorganic compound, in which measured current-voltage characteristics of a thin-film layer formed from the composite material which is sandwiched between electrodes each having a work function of 3.5 eV to 5.5 eV follow the following Formula (1).

$$J = \left\{ A\exp\left(\frac{-\phi_a}{2kT}\right) \right\} V + BV^n \quad (1)$$

(J denotes a current density; V, a voltage; $\phi_a$, activation energy for carrier generation in the composite material; k, Boltzmann constant; T, a temperature; A and B are parameters determined by a distance between the pair of electrodes d, the amount of elementary charge q, a mobility μ determined by the kind of the composite material, a dielectric constant ∈, the number of traps per unit volume Nt, the number of LUMO levels per volume of the organic compound in the composite material $N_{LUMO}$; and n, an integer of 2 to 10.)

Note that, at this time, $\phi_a$ is preferably 0.01 eV to 0.5 eV. In addition, a thickness of the thin-film layer at the time of measuring the current-voltage characteristics is preferably 10 nm to 500 nm.

The inorganic compound preferably shows an electron-accepting property to the organic compound. In particular, many transition metal oxides show highly electron-accepting properties, and among them, titanium oxide, zirconium oxide, hafnium oxide, vanadium oxide, niobium oxide, tantalum oxide, chromium oxide, molybdenum oxide, tungsten oxide, manganese oxide, or rhenium oxide is suitable.

On the other hand, the organic compound preferably has a hole-transporting property. In particular, many aromatic amine compounds show highly hole-transporting properties, which are suitable. In addition, the aromatic amine compound is preferable in that the aromatic amine compound easily donates electrons to the inorganic compound showing an electron-accepting property.

A light emitting element with a low drive voltage can be obtained by providing the composite material of the invention in contact with an electrode of the light emitting element. In addition, as described above, the composite material of the invention does not substantially have a hole injection barrier with an electrode of 3.5 eV to 5.5 eV. Thus, general-purpose metal having a work function in this range can be used as the electrode of the light emitting element. Accordingly, an inexpensive light emitting element can be provided.

Therefore, another structure of the invention is a light emitting element including a first layer and a second layer containing a light emitting material between a first electrode and a second electrode, in which the first layer is provided in contact with the first electrode, and the first layer is formed from the above-described composite material of the invention.

In addition, another feature of the light emitting element of the invention is that an electrode and a layer in contact with the electrode (i.e. a layer using the composite material of the invention) form an ohmic contact with each other. In other words, another structure of the invention is a light emitting element including a first layer containing an organic compound and an inorganic compound and a second layer containing a light emitting material between a first electrode and a second electrode, in which the first layer is provided in contact with the first electrode, and the first electrode forms an ohmic contact with the first layer.

At this time, the inorganic compound preferably shows an electron-accepting property to the organic compound. In particular, many transition metal oxides show highly electron-accepting properties, and among them, titanium oxide, zirconium oxide, hafnium oxide, vanadium oxide, niobium oxide, tantalum oxide, chromium oxide, molybdenum oxide, tungsten oxide, manganese oxide, or rhenium oxide is suitable.

On the other hand, the organic compound preferably has a hole-transporting property. In particular, many aromatic amine compounds show highly hole-transporting properties, which are suitable. In addition, the aromatic amine compound is preferable in that the aromatic amine compound easily donates electrons to the inorganic compound showing an electron-accepting property.

Note that the first electrode is preferably an anode. In addition, the first electrode preferably contains a material having a work function of 3.5 eV to 5.5 eV.

Since the above-described light emitting element of the invention can reduce a drive voltage, a light emitting device having the light emitting element of the invention can also reduce power consumption. In addition, since the light emitting element of the invention can be manufactured at low cost, the light emitting device having the light emitting element of the invention can also be manufactured at low cost. Therefore, the light emitting device using the light emitting element of the invention is also included in the present invention.

Note that the light emitting device in this specification refers to an image display device or an illuminator using a light emitting element. Further, the light emitting device includes all of the following modules: a module having a light emitting element provided with a connector such as an anisotropic conductive film (FPC: Flexible Printed Circuit), a TAB (Tape Automated Bonding) tape, or a TCP (Tape Carrier Package); a module having a TAB tape or a TCP provided with a printed wiring board at the end thereof; and a module having an IC (Integrated Circuit) directly mounted on a light emitting element by a COG (Chip On Glass) method.

By carrying out the invention, a material which does not substantially have a hole injection barrier from an electrode can be provided. In addition, a material which does not substantially have a hole injection barrier with various electrodes can be provided. Further, a material having these characteristics and high heat resistance can be provided.

In addition, by using the material, a light emitting element and a light emitting device with a low drive voltage can be provided. Further, an inexpensive light emitting element and an inexpensive light emitting device can be provided by using a combination of the material and general-purpose metal.

BRIEF DESCRIPTION OF DRAWINGS

FIGS. 5A to 5C show a structure of a light emitting device of the present invention.

BEST MODE FOR CARRYING OUT THE INVENTION

Before explaining modes of a composite material of the present invention, the case of using a conventional organic compound is given as an example to explain its problem.

Figure 2:
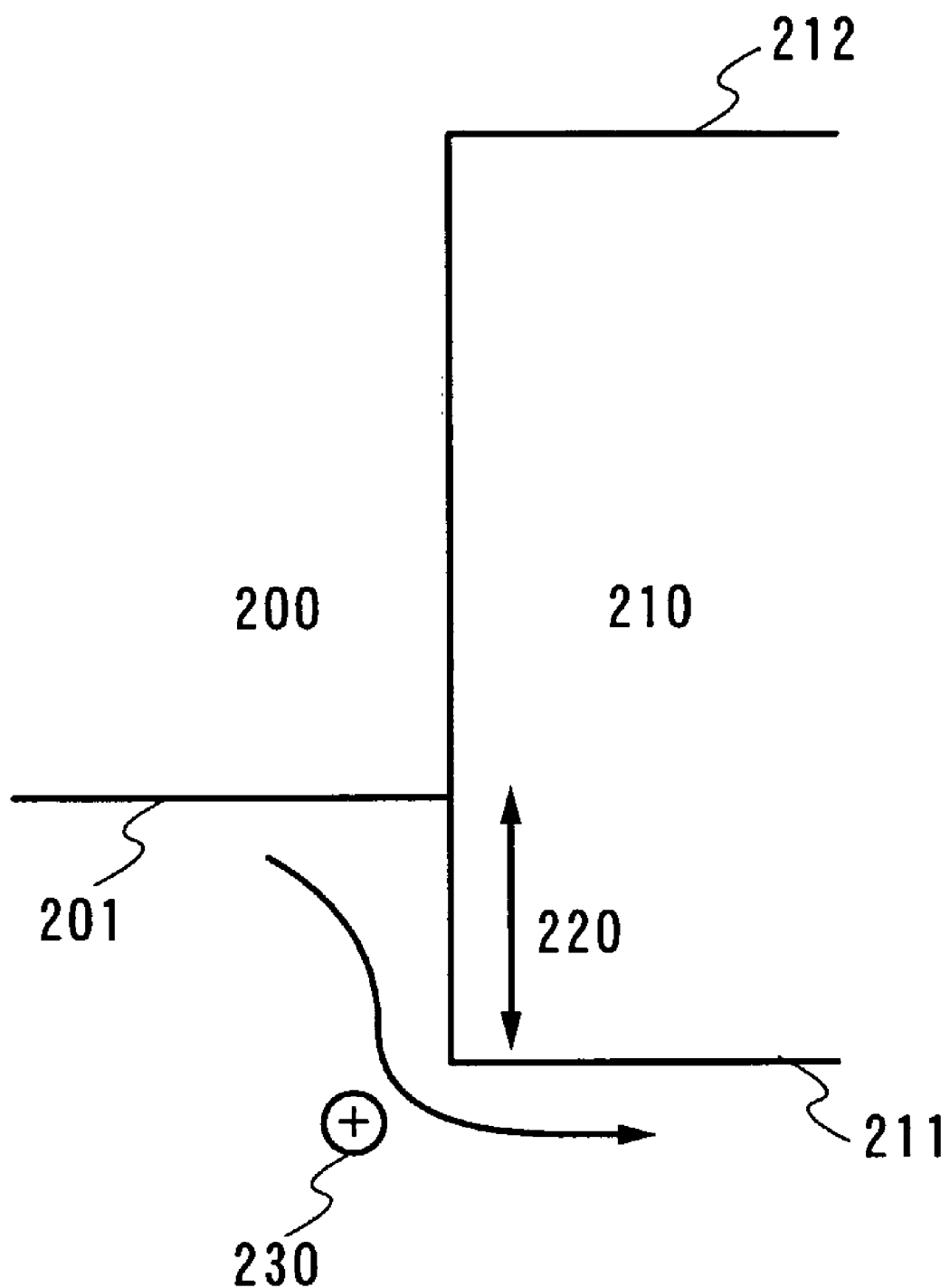
FIG. 2 shows contact between a conventional organic compound and an electrode.

FIG. 2 is a schematic diagram of an energy level for explaining the case where a hole 230 is injected from an electrode 200 into an organic compound 210. In the diagram, reference numeral 201 denotes a Fermi level of the electrode 200; 211, a HOMO level of the organic compound 210; and 212, a LUMO level of the organic compound 210. Since holes are generally injected into a HOMO level, reference numeral 220 in the diagram corresponds to a Schottky barrier for the hole 230. Thus, in order to lower the Schottky barrier 220, it is necessary to lower a location of the Fermi level 201 of the electrode (in other words, to increase a work function) or to raise a location of the HOMO level 211 of the organic compound. However, it is relatively difficult to raise the HOMO level of the organic compound which can accept and transport holes to more than −5 eV, and it is difficult to substantially eliminate the Schottky barrier 220 unless an electrode having a work function higher than 5 eV.

At this time, the amount of current when the hole injected from the electrode 200 into the organic compound 210 flows is controlled by a formula of current density Js of a Schottky injection mechanism expressed by the following Formula (2). In other words, such a device in which the electrode 200 is combined with the organic compound 210 is not controlled by conductivity of the bulk, but the device is controlled by injection.

$$J_s = A * T^2 \exp\left\{-\frac{\phi_B - q\sqrt{qV/(4\pi\varepsilon_i d)}}{kT}\right\} \qquad (2)$$

(T denotes a temperature; $\phi_B$, a Schottky barrier; q, the amount of elementary charge; V, a voltage; $\varepsilon_i$, a dielectric constant of the organic compound; d, inter-electrode distance; and k, Boltzmann constant.)

Thus, since flowing current greatly depends on a Schottky barrier $\phi_B$ in the conventional organic compound, there is significant limitation on the kind of materials of an electrode and an organic compound in the device in which the electrode is combined with the organic compound.

It is the composite material of the invention that overcomes this problem. Hereinafter, one mode of the composite material of the invention is first explained as Embodiment Mode 1.

Embodiment Mode 1

One mode of the composite material of the invention is a structure including an organic compound and an inorganic compound which shows an electron-accepting property to the organic compound. At this time, the composite material is made to have a property of an impurity semiconductor (p-type) having a high impurity concentration by mixing a large amount of inorganic compounds showing an electron-accepting property. In other words, a conduction mechanism is band conduction.

Figure 1A:
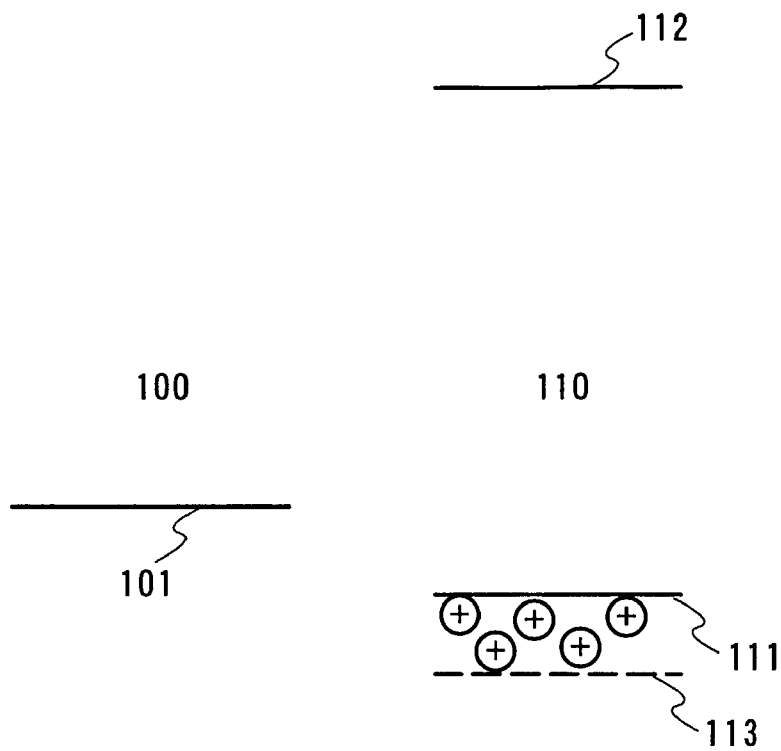
FIGS. 1A and 1B show contact between a composite material of the present invention and an electrode.
Figure 1B:
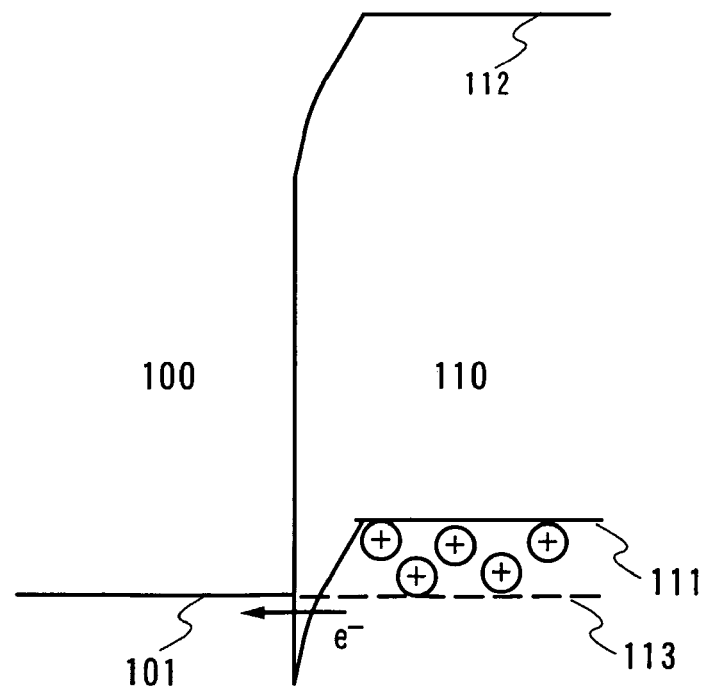

In the case of having a property of the impurity semiconductor (p-type) having a high impurity concentration, a schematic diagram of an energy level when a hole is injected from an electrode 100 into a composite material 110 of the invention is as shown in FIGS. 1A and 1B. FIG. 1A schematically shows a state before the electrode 100 has contact with the composite material 110 of the invention. Reference numeral 101 denotes a Fermi level of the electrode 100; 111, an upper limit of a valence band of the composite material 110; 112, a lower limit of a conduction band of the composite material 110; and 113 is a Fermi level of the composite material 110.

When the electrode 100 has contact with the composite material 110, electrons move so that the Fermi levels correspond to each other. Accordingly, since the electron can pass through a barrier by a tunneling effect as shown in FIG. 1B, a Schottky barrier (here, a hole injection barrier) substantially disappears.

Meanwhile, ohmic current flows through the impurity semiconductor in which the Schottky barrier has disappeared, and current-voltage characteristics thereof follow Ohm's law. Consequently, current density $J_{oh}$ thereof can be expressed by the following Formula (3).

$$J_{oh} = \sigma E = (\sigma/d)V \qquad (3)$$

(σ denotes a conductivity; E, a field intensity; d, inter-electrode distance; and V, a voltage.)

At this time, the conductivity σ of the impurity semiconductor has temperature dependency such that an Arrhenius plot becomes linear as expressed by the following Formula (4).

$$\sigma = \sigma_0 \exp\left(\frac{-\phi_a}{2kT}\right) \quad (4)$$

($\phi_a$ denotes activation energy for carrier generation; T, a temperature; k, Boltzmann constant; and $\phi_0$, a material-specific constant.)

Consequently, current density $J_{oh}$ of the impurity semiconductor in which the Schottky barrier has disappeared is expressed by the following Formula (5) according to Formulae (3) and (4).

$$J_{oh} = (\sigma_0/d)\left\{\exp\left(\frac{-\phi_a}{2kT}\right)\right\}V \quad (5)$$

In the case of the composite material of the invention, band-conduction current expressed by Formula (5) can flow as a result of the substantial disappearance of the Schottky barrier. Since this characteristic can be obtained almost independently of the location of the HOMO level of the organic compound in the composite material, various organic compounds can be applied to the composite material of the invention.

And, not only that, the present inventor has found that a term of a trap-charge limited current is added to current flowing through the composite material of the invention. The trap-charge limited current is a kind of space-charge limited current, and is current peculiar to a thin film at the time of conducting carriers injected from outside, and hopping conduction among molecules of the organic compound corresponds to it. Current density $J_t$ thereof is expressed by exponentiation of voltage as in the following Formula (6). Note that B is affected by mobility, a dielectric constant, the number of traps, inter-electrode distance, or the like; therefore, it can be said that B is a parameter determined by the inter-electrode distance or the kind of the composite material.

$$J_t = BV^n \quad (6)$$

(B denotes a parameter determined by inter-electrode distance and the kind of the composite material; n, an integer of 2 to 10; and V, a voltage.)

In other words, current density $J = J_{oh} + J_t$ of the current flowing through the composite material of the invention is expressed by the following Formula 1 according to Formulae (5) and (6) (note that it is set that $\sigma_0/d = A$).

$$J = \left\{A\exp\left(\frac{-\phi_a}{2kT}\right)\right\}V + BV^n \quad (1)$$

(J denotes a current density; V, a voltage; $\phi_a$, activation energy for carrier generation in the composite material; k, Boltzmann constant; T, a temperature; A and B are parameters determined by a distance between the pair of electrodes d, the amount of elementary charge q, a mobility μ determined by the kind of the composite material, a dielectric constant ∈, the number of traps per unit volume Nt, the number of LUMO levels per volume of the organic compound in the composite material $N_{LUMO}$; and n, an integer of 2 to 10.)

A factor in causing the current-voltage characteristics of the composite material of the invention to follow Formula (1) is that the composite material of the invention has a property of an impurity semiconductor having high impurity concentration (which forms an ohmic contact with an electrode and follows Ohm's law) and also a property of the used organic compound (with which trap-charge limited current flows). In other words, one feature of the composite material of the invention showing current-voltage characteristics expressed by Formula (1) is to have both band conduction using carrier generation (here, hole generation) by adding an electron-accepting material to the organic compound and hopping conduction between organic compounds when the organic compound transports carriers injected from outside, and to be able to conduct a large amount of current.

Further, it is understood that the above-described current-voltage characteristics can be obtained when a material having a work function of 3.5 eV to 5.5 eV is used for the electrode. Formula (1) is a formula assuming an ohmic contact, which indicates that the composite material of the invention can form an ohmic contact with the material having a work function of 3.5 eV to 5.5 eV.

Materials suitable for forming the composite material of the invention in Embodiment Mode 1 are listed below, but the invention is not limited to these.

The composite material of the invention in Embodiment Mode 1 contains an organic compound and an inorganic compound, and the inorganic compound shows an electron-accepting property to the organic compound. An effect such as improvement in heat resistance can also be obtained by using the inorganic compound. The inorganic compound is not limited particularly, but transition metal oxide is preferable. Titanium oxide, zirconium oxide, hafnium oxide, vanadium oxide, niobium oxide, tantalum oxide, chromium oxide, molybdenum oxide, tungsten oxide, manganese oxide, or rhenium oxide is suitable.

Here, since the inorganic compound shows an electron-accepting property, holes are generated in the organic compound. Therefore, a hole-transporting organic compound is preferable as the organic compound. As the hole-transporting organic compound, for example, phthalocyanine (abbr.: $H_2Pc$), copper phthalocyanine (abbr.: CuPc), vanadyl phthalocyanine (abbr.: VOPc), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 1,3,5-tris[N,N-di(m-tolyl)amino]benzene (abbr.: m-MTDAB), N,N'-diphenyl-N,N'-bis(3-methylphenyl)-1,1'-biphenyl-4,4'-diamine (abbr.: TPD), 4,4'-bis[N-(1-naphthyl)-N-phenylamino]biphenyl (abbr.: NPB), 4,4'-bis{N-[4-di(m-tolyl)amino]phenyl-N-phenylamino}biphenyl (abbr.: DNTPD), 4,4'-bis[N-(4-biphenylyl)-N-phenylamino]biphenyl (abbr.: BBPB), 4,4',4"-tri(N-carbazolyl)triphenylamine (abbr.: TCTA), or the like can be used; however, the organic compound is not limited to these. Among the above-mentioned compounds, an aromatic amine compound typified by TDATA, MTDATA, m-MTDAB, TPD, NPB, DNTPD, BBPB, TCTA, or the like easily generates holes, and is a compound group suitable for the organic compound.

As a method for manufacturing the composite material of the invention, a technique for evaporating both an organic compound and an inorganic compound as described above by resistance heating for co-evaporation can be given. In addition, co-evaporation may be performed by evaporating the organic compound by resistance heating and evaporating the inorganic compound by an electron beam (EB). Further, a technique for simultaneously depositing both the organic compound and the inorganic compound by evaporating the organic compound by resistance heating and by sputtering the inorganic compound can also be given. Alternatively, deposition may be performed by a wet method.

Embodiment Mode 2

Figure 3:
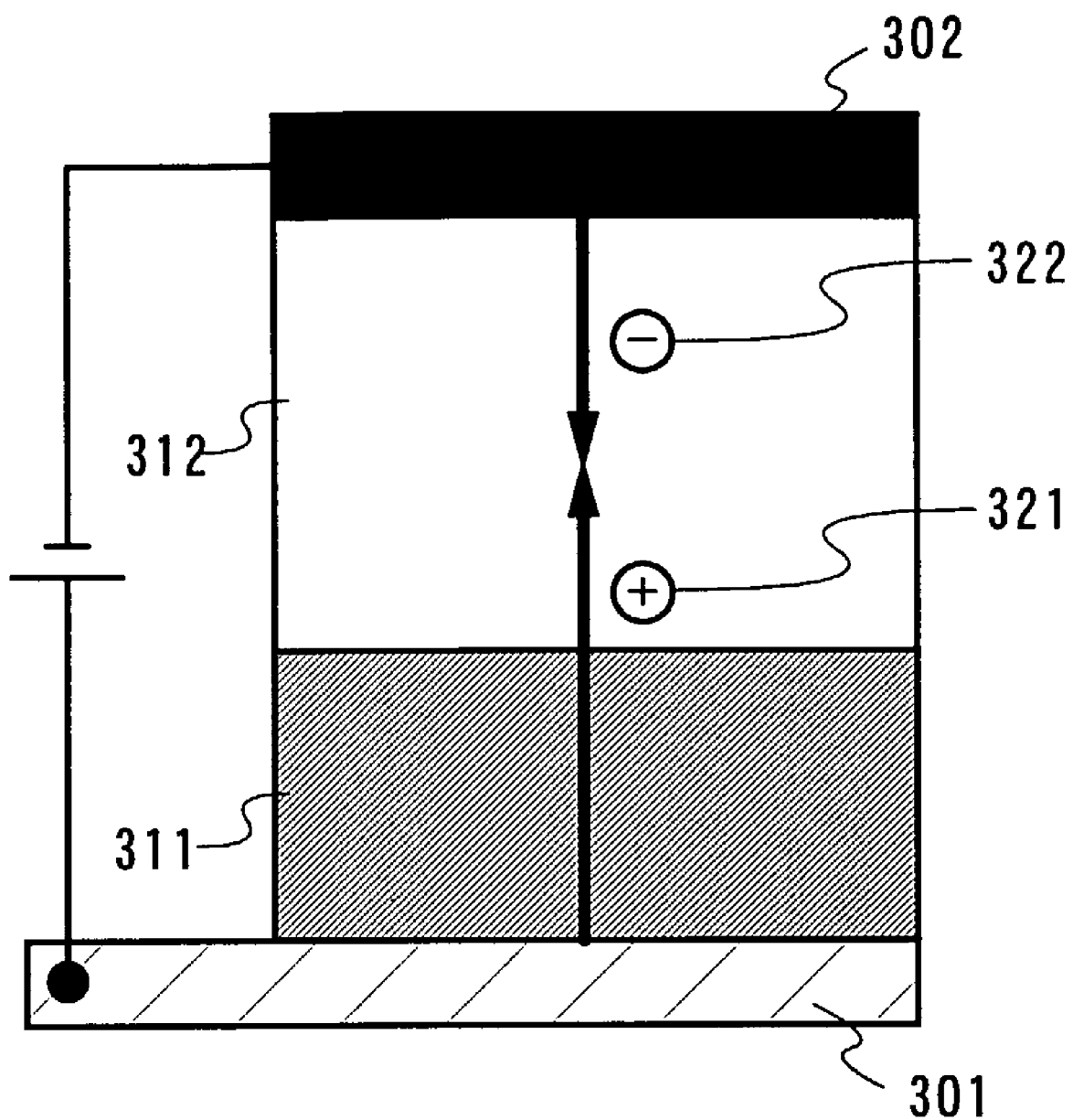
FIG. 3 shows a structure of a light emitting element of the present invention.

Embodiment Mode 2 explains a current-excitation light emitting element using such a composite material of the present invention as described in Embodiment Mode 1. A typical element structure is shown in FIG. 3. The light emitting element of the invention includes a first layer 311 formed from such a composite material of the invention as described in Embodiment Mode 1 and a second layer 312 containing a light emitting material between a first electrode 301 and a second electrode 302, in which the first layer 311 is provided in contact with the first electrode 301.

Embodiment Mode 2 exemplifies an element in which current flows when a potential of the first electrode 301 is higher than that of the second electrode 302, and a hole 321 and an electron 322 are recombined with each other in the second layer 312 to emit light. Thus, the first electrode 301 serves as an anode.

As described in Embodiment Mode 1, when a work function of a material for forming the first electrode 301 is approximately 3.5 eV to 5.5 eV, the first layer 311 forms an ohmic contact with the first electrode 301. Thus, a light emitting element with a low drive voltage can be manufactured.

In addition, a material having a work function ranging from 3.5 eV to 5.5 eV can be used for the first electrode 301. Specifically, a transparent electrode of indium tin oxide (hereinafter referred to as ITO), indium tin oxide to which silicon is added (hereinafter referred to as ITSO), or the like, titanium, molybdenum, tungsten, nickel, gold, platinum, silver, aluminum, an alloy thereof, or the like can be used. In particular, titanium, molybdenum, aluminum, or an alloy thereof is general-purpose metal often used for a wiring or the like, and when used for the first electrode 301, an inexpensive light emitting element can be provided. It is one feature of the invention that metal normally having difficulty in hole injection, such as aluminum (having a work function of approximately 4 eV), can be used for the first electrode 301.

The second electrode 302 can be formed from the same material as the first electrode 301. Note that metal having a low work function, such as lithium, magnesium, calcium, or barium or an alloy thereof may be used.

Note that either or both the first electrode 301 and the second electrode 302 may be transparent to extract light from the light emitting element. In addition, a substrate for supporting the light emitting element may be provided either on the first electrode 301 side or on the second electrode 302 side.

Subsequently, the second layer 312 is explained. The second layer 312 is a layer having a light-emitting function, and may contain at least a light emitting organic compound. In addition, the second layer 312 can be appropriately combined with a hole transporting material, an electron transporting material, or an electron injecting material. The second layer 312 may be a single layer of only a light emitting layer containing a light emitting organic compound, or it may be a multilayer combined with a hole transporting layer, an electron transporting layer, an electron injecting layer, or the like.

As the light emitting organic compound, for example, 9,10-di(2-naphthyl)anthracene (abbr.: DNA), 2-tert-butyl-9,10-di(2-naphthyl)anthracene (abbr.: t-BuDNA), 4,4'-bis(2,2-diphenylvinyl)biphenyl (abbr.: DPVBi), Coumarin 30, Coumarin 6, Coumarin 545, Coumarin 545T, perylene, rubrene, periflanthene, 2,5,8,11-tetra(tert-butyl)perylene (abbr.: TBP), 9,10-diphenylanthracene (abbr.: DPA), 5,12-diphenyltetracene, 4-(dicyanomethylene)-2-methyl-6-[p-(dimethylamino)styryl]-4H-pyran (abbr.: DCM1), 4-(dicyanomethylene)-2-methyl-6-[2-(julolidine-9-yl)ethenyl]-4H-pyran (abbr.: DCM2), 4-(dicyanomethylene)-2,6-bis[p-(dimethylamino)styryl]-4H-pyran (abbr.: BisDCM), or the like can be given. In addition, a compound which can emit phosphorescence can be used, such as bis[2-(4',6'-difluorophenyl)pyridinato-N,$C^{2'}$](picolinato)iridium (abbr.: FIrpic), bis{2-[3',5'-bis(trifluoromethyl)phenyl]pyridinato-N,$C^{2'}$}(picolinato) iridium (abbr.: Ir($CF_3$ppy)$_2$(pic)), tris(2-phenylpyridinato-N,$C^{2'}$)iridium (abbr.: Ir(ppy)$_3$), (acetylacetonato)bis(2-phenylpyridinato-N,$C^{2'}$)iridium (abbr.: Ir(ppy)$_2$(acac)), (acetylacetonato)bis[2-(2'-thienyl)pyridinato-N,$C^{3'}$]iridium (abbr.: Ir(thp)$_2$(acac)), (acetylacetonato)bis(2-phenylquinolinato-N,$C^{2'}$)iridium (abbr.: Ir(pq)$_2$(acac)), or (acetylacetonato)bis[2-(2'-benzothienyl)pyridinato-N,$C^{3'}$]iridium (abbr.: Ir(btp)$_2$(acac)).

As the hole transporting material which can be used in combination with the light emitting organic compound, for example, the previously-described TDATA, MTDATA, m-MTDAB, TPD, NPB, DNTPD, BBPB, TCTA, or the like can be given. As the electron transporting material, for example, tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), bis(2-methyl-8-quinolinolato)(4-phenylphenolato)aluminum (abbr.: BAlq), bis[2-(2'-hydroxyphenyl)benzoxazolato]zinc (abbr.: Zn(BOX)$_2$), bis[2-(2'-hydroxyphenyl)benzothiazolato]zinc (abbr.: Zn(BTZ)$_2$), bathophenanthroline (abbr.: BPhen), bathocuproin (abbr.: BCP), 2-(4-biphenylyl)-5-(4-tert-butylphenyl)-1,3,4-oxadiazole (abbr.: PBD), 1,3-bis[5-(4-tert-butylphenyl)-1,3,4-oxadiazole-2-yl]benzene (abbr.: OXD-7), 2,2',2"-(1,3,5-benzenetriyl)-tris(1-phenyl-1H-benzimidazole) (abbr.: TPBI), 3-(4-biphenylyl)-4-phenyl-5-(4-tert-butylphenyl)-1,2,4-triazole (abbr.: TAZ), 3-(4-biphenylyl)-4-(4-ethylphenyl)-5-(4-tert-butylphenyl)-1,2,4-triazole (abbr.: p-EtTAZ), or the like can be given; however, the electron transporting material is not limited thereto. As the electron injecting material, an ultrathin film of an insulator, for example, alkali metal halide such as LiF or CsF, alkaline earth metal halide such as $CaF_2$, alkali metal oxide such as $Li_2O$, or the like is often used besides the above-described electron transporting material. Further, an alkali metal complex such as lithium acetylacetonate (abbr.: Li(acac)) or 8-quinolinolato-lithium (abbr.: Liq) is also effective. Moreover, a material in which the above-mentioned electron transporting material is mixed with metal having a low work function, such as Mg, Li, or Cs, by co-evaporation or the like can also be used.

Note that the light emitting organic compound may be dispersed in the above-mentioned hole transporting material or electron transporting material, 4,4'-di(N-carbazolyl)biphenyl (abbr.: CBP), or the like.

Since the first layer 311 is formed from the composite material of the invention, the first layer 311 can be formed by such a technique as described in Embodiment Mode 1. In addition, the second layer 312 can be formed by an evaporation method using resistance heating or a wet method such as spin coating, ink-jetting, or printing. Similarly, the first electrode 301 and the second electrode 302 can also be formed by an evaporation method using resistance heating, an EB evaporation method, a sputtering method, a wet method, or the like.

Embodiment Mode 3

Figure 4:
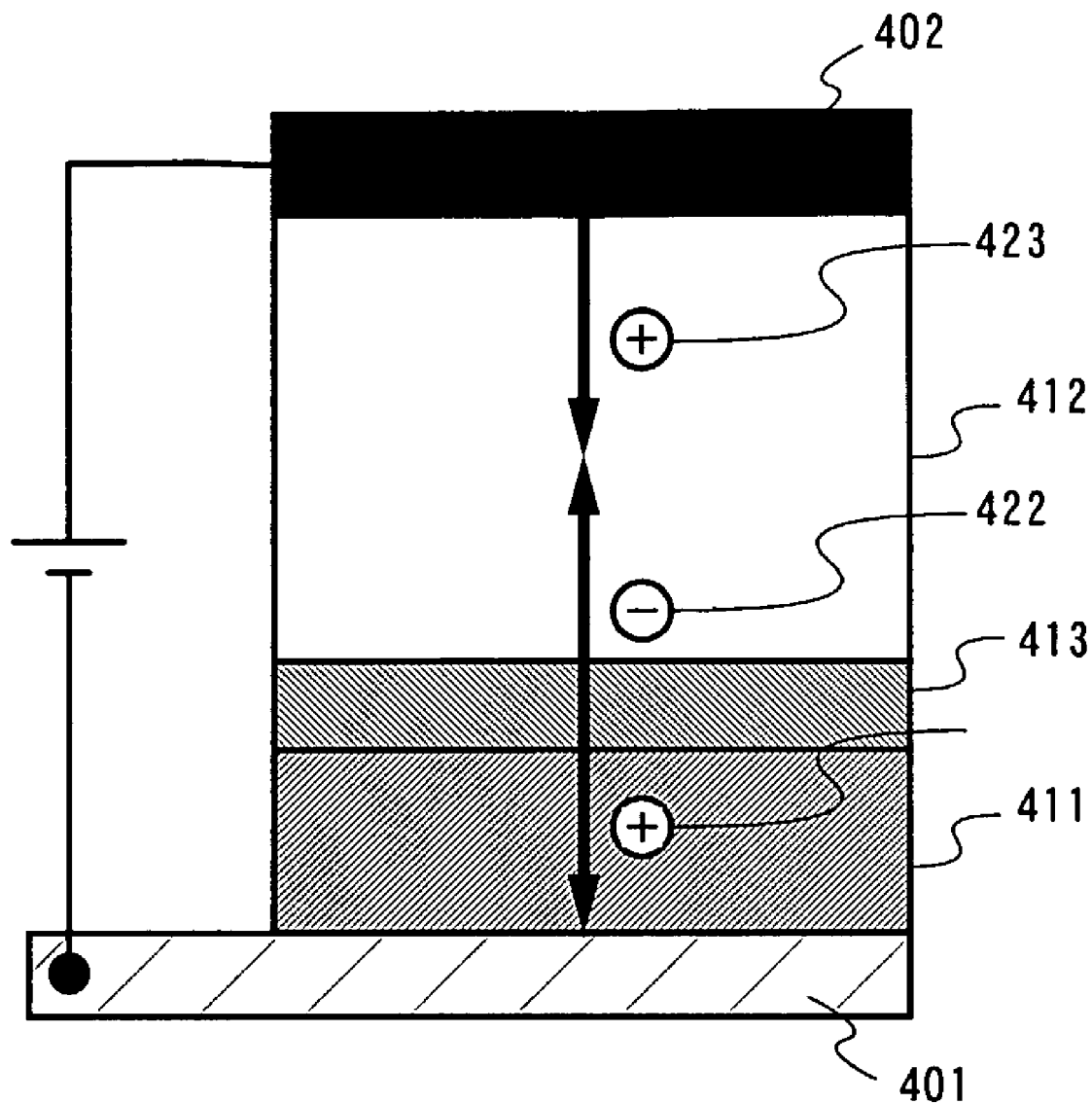
FIG. 4 shows a structure of a light emitting element of the present invention.

Embodiment Mode 3 explains one mode of the light emitting element of the present invention, which is different from that in Embodiment Mode 1. An element structure is shown in FIG. 4. A light emitting element of Embodiment Mode 3 includes a first layer 411 formed from the composite material of the invention as described in Embodiment Mode 1 and a second layer 412 containing a light emitting material between a first electrode 401 and a second electrode 402, in which the first layer 411 is provided in contact with the first electrode 401. In addition, a third layer 413 which generates electrons is provided between the first layer 411 and the second layer 412.

In Embodiment Mode 3, current flows when a potential of the first electrode 401 is lower than that of the second electrode 402. At this time, an electron 422 injected from the third layer 413 into the second layer 412 and a hole 423 injected from the second electrode 402 are recombined with each other in the second layer 412 to emit light. On the other hand, the first layer 411 using the composite material of the invention transfers a hole 421 generated in the vicinity of an interface between the first layer 411 and the third layer 413 to the first electrode 401.

As described in Embodiment Mode 1, when a work function of a material for forming the first electrode 401 is approximately 3.5 eV to 5.5 eV, the first layer 411 forms an ohmic contact with the first electrode 401. Thus, a light emitting element with a low drive voltage can be manufactured.

In addition, a material having a work function ranging from 3.5 eV to 5.5 eV can be used for the first electrode 401. Specifically, a transparent electrode of indium tin oxide (ITO), indium tin oxide to which silicon is added (ITSO), or the like, titanium, molybdenum, tungsten, nickel, gold, platinum, silver, aluminum, an alloy thereof, or the like can be used. In particular, titanium, molybdenum, aluminum, or an alloy thereof is general-purpose metal often used for a wiring or the like, and when used for the first electrode 401, an inexpensive light emitting element can be provided. The second electrode 402 can also be formed from the same material as the first electrode 401.

Note that either or both the first electrode 401 and the second electrode 402 may be transparent to extract light from the light emitting element. In addition, a substrate for supporting the light emitting element may be provided either on the first electrode 401 side or on the second electrode 402 side.

The second layer 412 is a layer having a light-emitting function, and may contain at least a light emitting organic compound. As a structure thereof, a similar structure to that of the second layer described in Embodiment Mode 2 can be employed.

The third layer is not particularly limited as long as it can generate electrons. Specifically, the third layer may include a layer containing an electron transporting organic compound and a material showing an electron donating property to the organic compound. As the electron transporting organic compound, the previously-described Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, or the like can be used. As the material showing an electron donating property, alkali metal or alkaline earth metal such as lithium, magnesium, calcium, or barium or an alloy thereof can be given. An alkali metal compound or an alkaline earth metal compound such as lithium oxide, barium oxide, lithium nitride, magnesium nitride, or calcium nitride can also be used.

Note that a hole injecting layer may be provided between the second layer 412 and the second electrode 402. As a material which can be used for the hole injecting layer, the composite material of the invention as described in Embodiment Mode 1 may be employed as well as H$_2$Pc, CuPc, or VOPc.

Since the first layer 411 is formed from the composite material of the invention, the first layer 411 can be formed by such a technique as described in Embodiment Mode 1. In addition, the second layer 412 or the third layer 413 can be formed by an evaporation method by resistance heating or a wet method such as spin coating, ink-jetting, or printing. Similarly, the first electrode 401 and the second electrode 402 can also be formed by an evaporation method using resistance heating, an EB evaporation method, a sputtering method, a wet method, or the like.

Embodiment Mode 4

A structure of the light emitting device of the present invention is explained with reference to FIGS. 5A to 5C. Note that FIG. 5A is a top view of the light emitting device; FIG. 5B is a cross-sectional detail view taken along line A-A' in FIG. 5A; and FIG. 5C is a cross-sectional structure view of the light emitting device. In FIG. 5A, a source side driver circuit 501, a pixel portion 502, and a gate side driver circuit 503 are indicated by dotted lines. In addition, a sealing substrate 504 is fixed to a substrate 510, over which a TFT and a light emitting element are formed, with a sealant 505. The source side driver circuit 501, the pixel portion 502, and the gate side driver circuit 503 are sealed between the substrate 510 and the sealing substrate 504. An inner region surrounded by the sealant 505 is filled with a filler 506. The filler 506 may be an inert gas or a solid such as a resin. Note that a resin material having low water vapor permeability is preferably used as the sealant 505 and the filler 506.

A connection wiring 507 transmits a signal inputted to the source side driver circuit 501 and the gate side driver circuit 503, and is arranged so as to be extended to an end portion of the substrate 510. A flexible printed circuit board (FPC) 508 to be connected to an external circuit is connected to an end portion of the connection wiring 507. A proportion of the pixel portion 502 to the substrate 510 can be increased by forming a seal pattern with the sealant 505 so as to overlap this connection portion. In other words, a width of a so-called frame region where a driver circuit or a connection region such as an FPC is formed over the substrate 510 can be reduced.

FIG. 5C is a cross-sectional structure view of the light emitting device. An element formation region 808 for the source side driver circuit, the pixel portion, the gate side driver circuit, or the like over the substrate 510 is sealed with the filler 506 and the sealing substrate 504. The flexible printed circuit board (FPC) 508 is connected to a circuit board 807 arranged on the substrate 510 side or the sealing substrate 504 side. The circuit board 807 is provided with a control circuit for controlling this light emitting device, a power supply circuit, or the like. Downsizing of this module can be attempted by bending and connecting the flexible printed circuit board (FPC) 508 to the circuit board 807 arranged on the substrate 810 side or the sealing substrate 504 side. When such a module structure is applied to a small electronic device such as a cellular phone or an electronic organizer, the device can be attempted to be miniaturized.

Subsequently, a cross-sectional structure is explained with reference to FIG. 5B. A driver circuit portion and a pixel portion are formed over the substrate 510, but here, the source side driver circuit 501 which is a driver circuit portion and the pixel portion 502 are shown.

Note that a CMOS circuit in which an n-channel TFT 523 is combined with a p-channel TFT 524 is formed as the source side driver circuit 501. In addition, a TFT for forming a driver circuit may be formed with a well-known CMOS circuit, PMOS circuit, or NMOS circuit. In this embodiment mode, a driver-integrated type in which a driver circuit is formed over a substrate is shown; however, the driver circuit does not necessarily have to be formed over the substrate. The driver circuit can be formed outside the substrate instead of being formed over the substrate.

The pixel portion 502 is formed with a plurality of pixels each including a switching TFT 511, a current control TFT 512, and a first electrode 513 electrically connected to a drain of the current control TFT 512. Note that an insulator 514 is formed to cover an end portion of the first electrode 513. Here, the insulator 514 is formed using a positive-type photosensitive acrylic resin film.

In addition, the insulator 514 is formed to have a curved surface with a curvature at an upper end portion or a lower end portion in order to make coverage favorable. In the case of using, for example, a positive-type photosensitive acrylic as a material of the insulator 514, the insulator 514 is preferably formed to have a curved surface with a curvature radius (0.2 μm to 3 μm) only at an upper end portion. Further, as the insulator 514, either a photosensitive negative type which becomes insoluble in an etchant by light or a photosensitive positive type which becomes soluble in an etchant by light can be used.

A layer 515 and a second electrode 516 are formed over the first electrode 513, which constitutes part of a light emitting element 517. The light emitting element 517 may employ such a structure of the light emitting element as described in Embodiment Mode 2 or 3. Thus, the layer 515 includes at least the first layer and the second layer described in Embodiment Mode 2 or 3, and the first layer is provided in contact with the first electrode 513. The first electrode 513 and the second electrode 516 may also employ the structure described previously in Embodiment 2 or 3.

Although the connection wiring 507 and the first electrode 513 are each formed from different materials in Embodiment Mode 4, they may be formed from the same material. In other words, the connection wiring 507 can be used as the first electrode 513 without any change. Therefore, the number of steps can be reduced, which leads to cost reduction. This is an advantage resulting from the fact that the first layer containing the composite material of the invention has capability of forming an ohmic contact with the first electrode 513.

By attaching the sealing substrate 504 to the substrate 510 with the sealant 505, a structure can be formed in which the light emitting element 517 is provided in the region surrounded by the substrate 510, the sealing substrate 504, and the sealant 505. Note that the region surrounded by the substrate 510, the sealing substrate 504, and the sealant 505 may be filled with the sealant 505 as well as an inert gas (nitrogen, argon, or the like) as the filler 506.

Note that an epoxy-based resin is preferably used as the sealant 505. This material is preferably a material which is permeated by as little moisture and oxygen as possible. In addition to a glass substrate or a quartz substrate, a plastic substrate formed from FRP (Fiberglass-Reinforced Plastics), RVF (polyvinylfluoride), myler, polyester, acrylic, or the like can be used for the sealing substrate 504.

As described above, the light emitting device using the light emitting element of the invention can be obtained.

Embodiment Mode 5

This embodiment mode explains various electric appliances completed by utilizing the light emitting device using the light emitting element of the present invention.

Examples of electric appliances manufactured by utilizing the light emitting device with the light emitting of the invention can be given as follows: a camera such as a video camera or a digital camera, a goggle type display (head-mounted display), a navigation system, a sound reproducing device (car audio, an audio component, or the like), a personal computer, a game machine, a portable information terminal (a mobile computer, a cellular phone, a portable game machine, an electronic book, or the like), an image reproducing device provided with a recording medium (specifically, a device which can reproduce the recording medium such as a digital versatile disc (DVD) and includes a display device capable of displaying images thereof), and the like. Specific examples thereof are shown in FIGS. 6A to 6G.

Figure 6A:
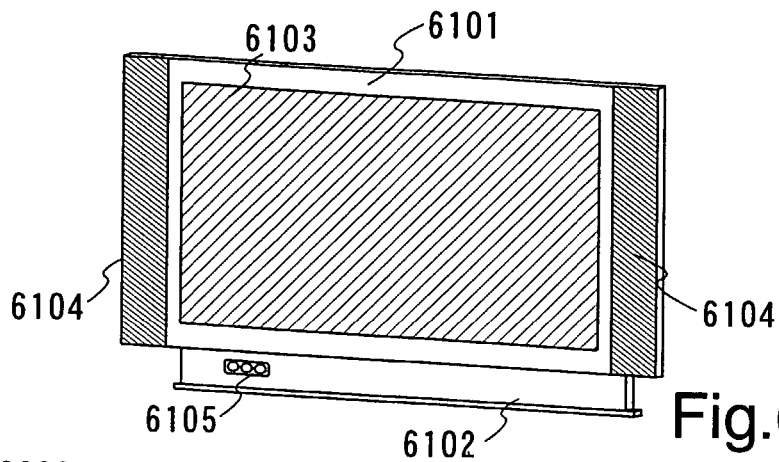
FIGS. 6A to 6G show electric appliances using light emitting devices of the present invention.

FIG. 6A shows a display device, which includes a chassis 6101, a support 6102, a display portion 6103, a speaker portion 6104, a video input terminal 6105, and the like. The display device is manufactured by using the light emitting device having the light emitting element of the invention for the display portion 6103. Note that the display device includes all devices used for displaying information, for example, for a personal computer, for TV broadcast reception, for advertisement display, and the like.

Figure 6B:
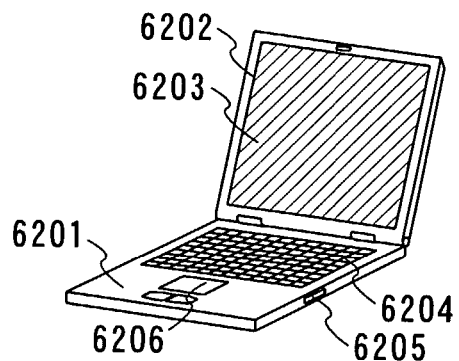

FIG. 6B shows a notebook-type personal computer, which includes a main body 6201, a chassis 6202, a display portion 6203, a keyboard 6204, an external connection port 6205, a pointing mouse 6206, and the like. The notebook-type personal computer can be manufactured by using the light emitting device having the light emitting element of the invention for the display portion 6203.

Figure 6C:
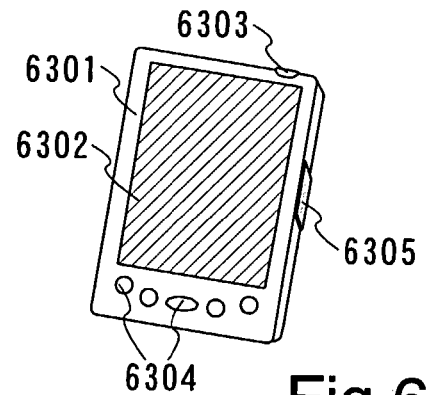

FIG. 6C shows a mobile computer, which includes a main body 6301, a display portion 6302, a switch 6303, an operation key 6304, an infrared port 6305, and the like. The mobile computer can be manufactured by using the light emitting device having the light emitting element of the invention for the display portion 6302.

Figure 6D:
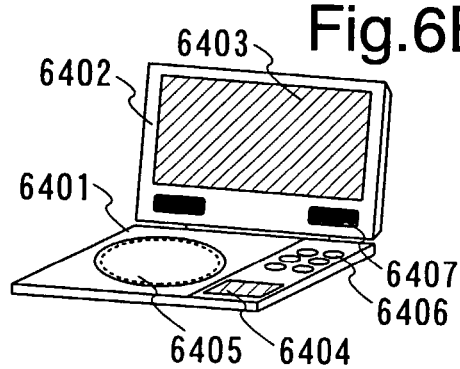

FIG. 6D shows a portable image reproducing device provided with a recording medium (specifically, a DVD reproducing device), which includes a main body 6401, a chassis 6402, a display portion A 6403, a display portion B 6404, a recording medium (a DVD or the like) reading portion 6405, an operation key 6406, a speaker portion 6407, and the like. The display portion A 6403 mainly displays image information, and the display portion B 6404 mainly displays character information. The portable image reproducing device can be manufactured by using the light emitting device having the light emitting element of the invention for the display portion A 6403 and the display portion B 6404. Note that the image reproducing device provided with a recording medium includes a home-use game machine and the like.

Figure 6E:
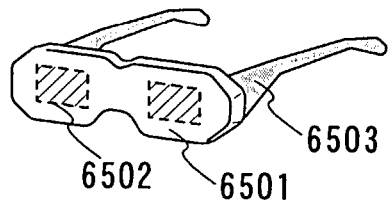

FIG. 6E shows a goggle type display (head-mounted display), which includes a main body 6501, a display portion 6502, and an arm portion 6503. The goggle type display can be manufactured by using the light emitting device having the light emitting element of the invention for the display portion 6502.

Figure 6F:
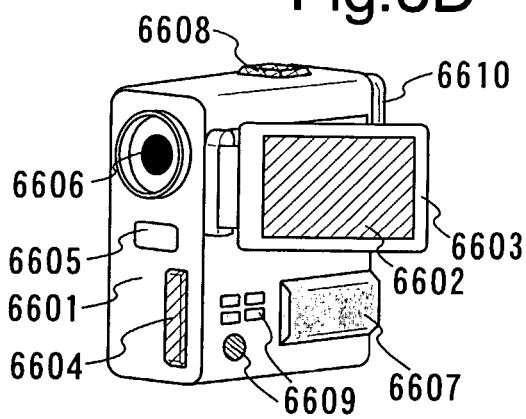

FIG. 6F shows a video camera, which includes a main body 6601, a display portion 6602, a chassis 6603, an external connection port 6604, a remote control receiving portion 6605, an image receiving portion 6606, a battery 6607, an audio input portion 6608, operation keys 6609, an eye piece portion 6610, and the like. The video camera can be manufactured by using the light emitting device having the light emitting element of the invention for the display portion 6602.

Figure 6G:
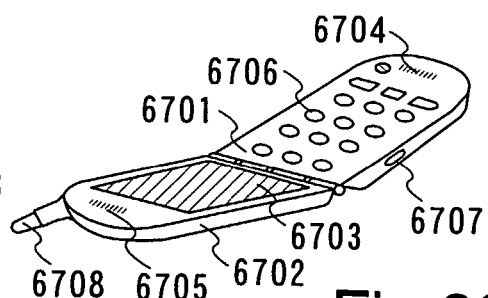

FIG. 6G shows a cellular phone, which includes a main body 6701, a chassis 6702, a display portion 6703, an audio input portion 6704, an audio output portion 6705, an operation key 6706, an external connection port 6707, an antenna 6708, and the like. The cellular phone can be manufactured by using the light emitting device having the light emitting element of the invention for the display portion 6703. Note that power consumption of the cellular phone can be reduced when the display portion 6703 displays white characters on a black background.

As described above, an application range of the light emitting device having the light emitting element of the invention is so wide that this light emitting device can be applied to electric appliances in various fields.

Embodiment 1

Embodiment 1 exemplifies a composite material of the present invention in which an organic compound is compounded with an inorganic compound showing an electron-accepting property to the organic compound. BBPB having a hole transporting property was used as the organic compound, and molybdenum oxide was used as the inorganic compound.

First, a glass substrate was fixed to a substrate holder in a vacuum evaporation apparatus. Next, BBPB and molybdenum oxide (VI) were separately put in different resistance-heating evaporation sources, and a composite material of the invention in which BBPB was compounded with molybdenum oxide was deposited under vacuum by a co-evaporation method. At this time, BBPB was evaporated at a deposition rate of 0.4 nm/s, and molybdenum oxide of a quarter (weight ratio) of the amount of BBPB was evaporated. Therefore, a molar ratio of BBPB to molybdenum oxide was 1:1. Note that a thickness thereof was 50 nm.

Figure 7:
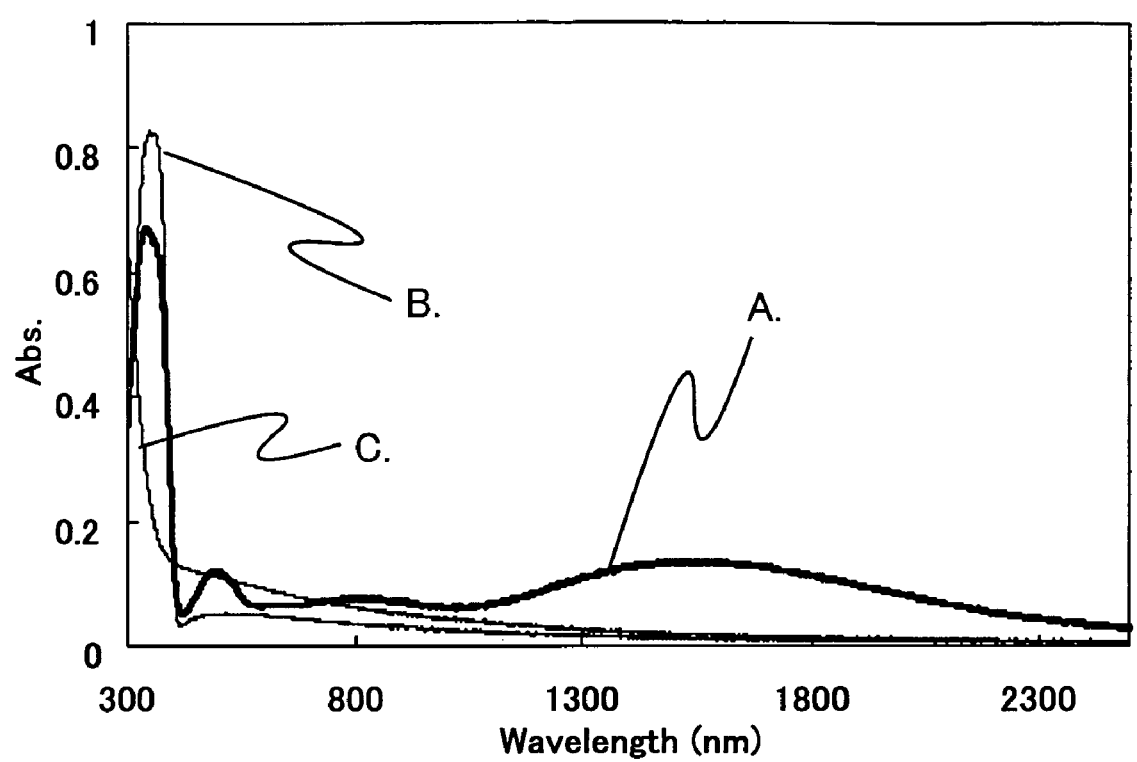
FIG. 7 shows an absorption spectrum of a composite material of the present invention.

A measurement result of an absorption spectrum of the BBPB-molybdenum oxide composite material which was deposited in this way is indicated by A. in FIG. 7. For comparison, absorption spectra of a film of only BBPB (B. in the diagram) and a film of only molybdenum oxide (C. in the diagram) are also shown.

As FIG. 7 shows, new absorption, which was not seen in each layer of only BBPB or molybdenum oxide, was observed in the composite material of A. at around 500 nm, 800 nm, and 1500 nm. It is thought that this is because BBPB and molybdenum oxide transfer electrons, and molybdenum oxide accepts electrons from BBPB and holes are generated in BBPB. Accordingly, it is suggested that in the same manner as an impurity semiconductor to which impurities are added at high concentration, the composite material of the invention can form an ohmic contact with various electrodes and can perform carrier transport like band conduction.

On the other hand, absorption at around 350 nm, which is also seen in the film of only BBPB (B.), is observed in the composite material (A.). This suggests that the composite material of the invention still has a property of BBPB, and can perform carrier transport by hopping conduction (trap-charge limited current).

Embodiment 2

Embodiment 2 exemplifies current-voltage characteristics of the composite material of the present invention. First, current-voltage characteristics of the above-described film of only BBPB are exemplified for comparison.

Comparative Example

First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, BBPB was put in a resistance-heating evaporation source, and BBPB was deposited under vacuum by a vacuum evaporation method. A thickness thereof was 200 nm. In addition, aluminum (Al) was deposited thereover with a thickness of 200 nm.

Figure 8A:
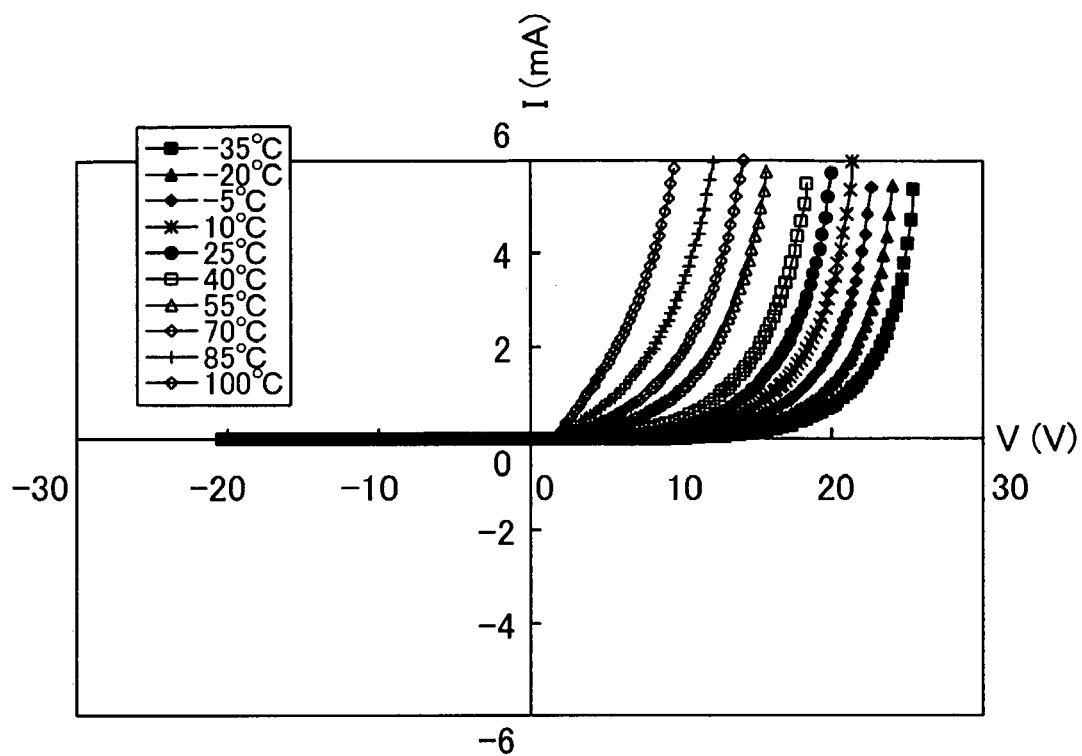
FIGS. 8A and 8B show current-voltage characteristics of Comparative Example.

As to the laminated structure thus obtained in which ITSO, BBPB, and Al are sequentially laminated over the substrate, measurement results of current-voltage characteristics at −35° C., −20° C., −5° C., 10° C., 25° C., 40° C., 55° C., 70° C., 85° C., and 100° C. are shown in FIG. 8A. Note that the case where a potential of ITSO is higher than that of Al is regarded as forward bias.

Since current flows under forward bias as shown in FIG. 8A, it is found that holes are injected from ITSO. Further, since current does not flow and rectification is shown under reverse bias, it is suggested that holes are not injected from Al.

Subsequently, the current-voltage characteristics obtained in FIG. 8A were analyzed to see whether the current flowing in Comparative Example was actually controlled by a Schottky injection mechanism (in other words, whether it is controlled by injection). $J_s$ at the time of V=0 (referred to as $J_0$) in the above Formula (2) is expressed by the following Formula (7).

$$J_0 = A * T^2 \exp\left(\frac{-\phi_a}{kT}\right) \quad (7)$$

By transforming this formula, the following Formula (8) can be obtained.

$$1n(J_0/T^2) = -\phi_B/(kT) + 1nA \quad (8)$$

Figure 8B:
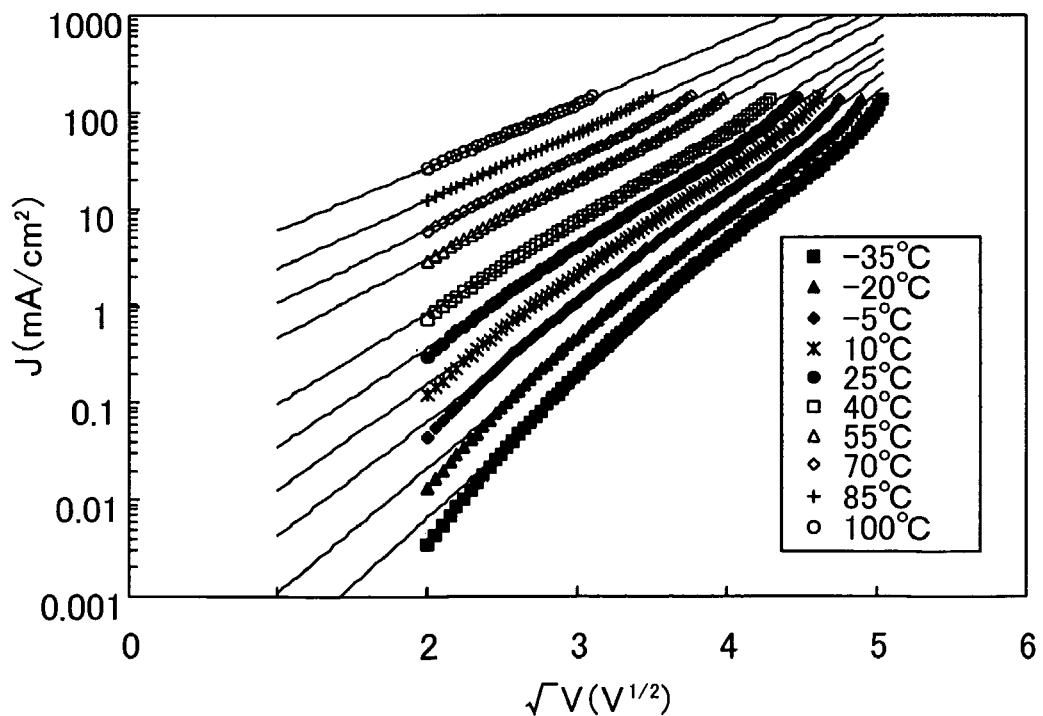

Therefore, if a Schottky injection mechanism is dominant, $J_0/T^2$ is supposed to be linear when plotted on an Arrhenius plot. As shown in FIG. 8B, $J_0$ at respective temperatures can be obtained by replacing the horizontal axis of the current-voltage characteristics obtained in FIG. 8A with a square root of a voltage V, replacing the vertical axis with a logarithm of a current density J, and extrapolating a plot (solid lines in the diagram) at respective temperatures. The obtained values of $J_0$ at respective temperatures are shown in the following Table 1.

TABLE 1

| temperatures [° C.] | $J_0$ [mA/cm$^2$] |
|---|---|
| −35 | $1.0 \times 10^{-5}$ |
| −20 | $6.0 \times 10^{-5}$ |
| −5 | $3.0 \times 10^{-4}$ |
| 10 | $1.0 \times 10^{-3}$ |
| 25 | $3.4 \times 10^{-3}$ |
| 40 | $1.1 \times 10^{-2}$ |
| 55 | $7.0 \times 10^{-2}$ |
| 70 | $1.8 \times 10^{-1}$ |
| 85 | $4.8 \times 10^{-1}$ |
| 100 | 1.3 |

Figure 9:
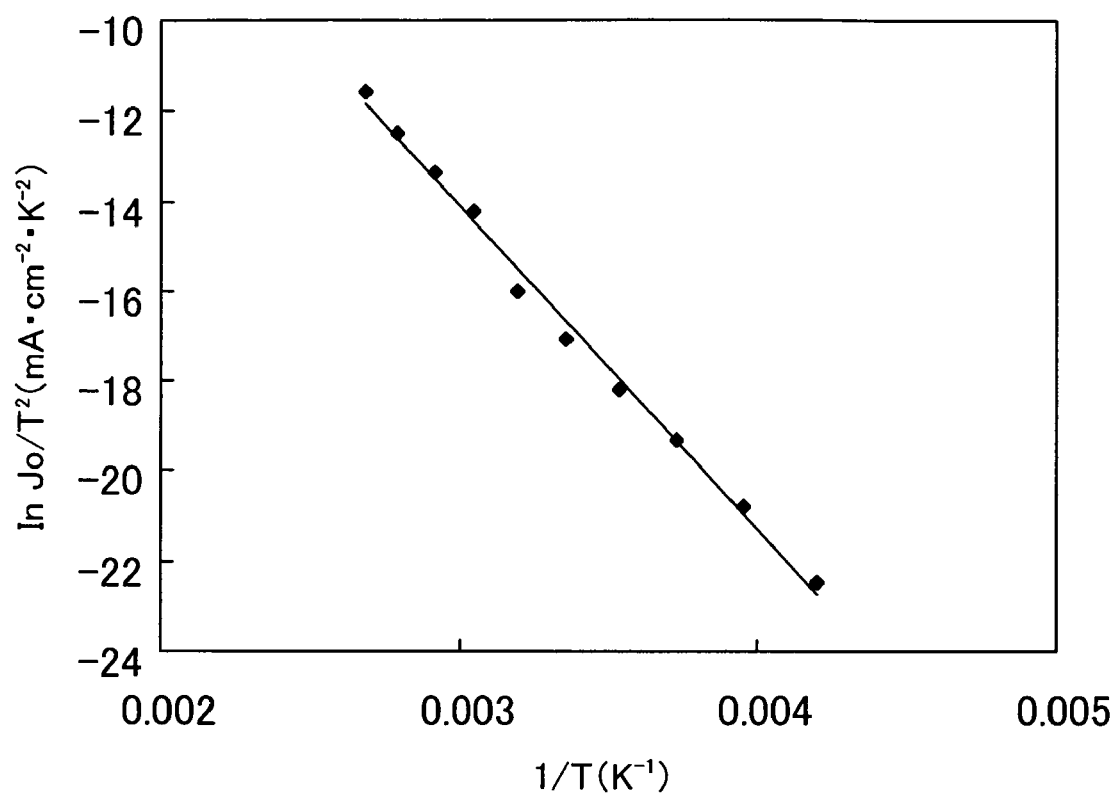
FIG. 9 shows an Arrhenius plot when Comparative Example is assumed to be a Schottky injection mechanism.

The values thus obtained of $J_0$ were used to make an Arrhenius plot according to Formula (8), and a result thereof is shown in FIG. 9. Since the Arrhenius plot shows linearity as shown in FIG. 9, it is suggested that hole injection from ITSO into BBPB is a Schottky injection mechanism. In addition, it is also found that the Schottky injection controls a current amount. Note that a Schottky barrier $\phi_B$ was found from the slope of the plot in FIG. 9 to be 0.62 eV.

Example

Subsequently, current-voltage characteristics of the composite material of the invention are exemplified. First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, BBPB, molybdenum oxide (VI), and rubrene were separately put in different resistance-heating evaporation sources, and the composite material of the invention formed from BBPB, molybdenum oxide, and rubrene was deposited under vacuum by a co-evaporation method. At this time, BBPB was evaporated at a deposition rate of 0.2 nm/s and an adjustment was performed so that BBPB: molybdenum oxide: rubrene becomes 2:0.75:0.02 (mass ratio). A thickness thereof was 200 nm to correspond to Comparative Example. Further, aluminum (Al) was deposited thereover with a thickness of 200 nm. Note that rubrene was added as a stabilizer of film quality, which is not necessarily required.

Figure 10A:
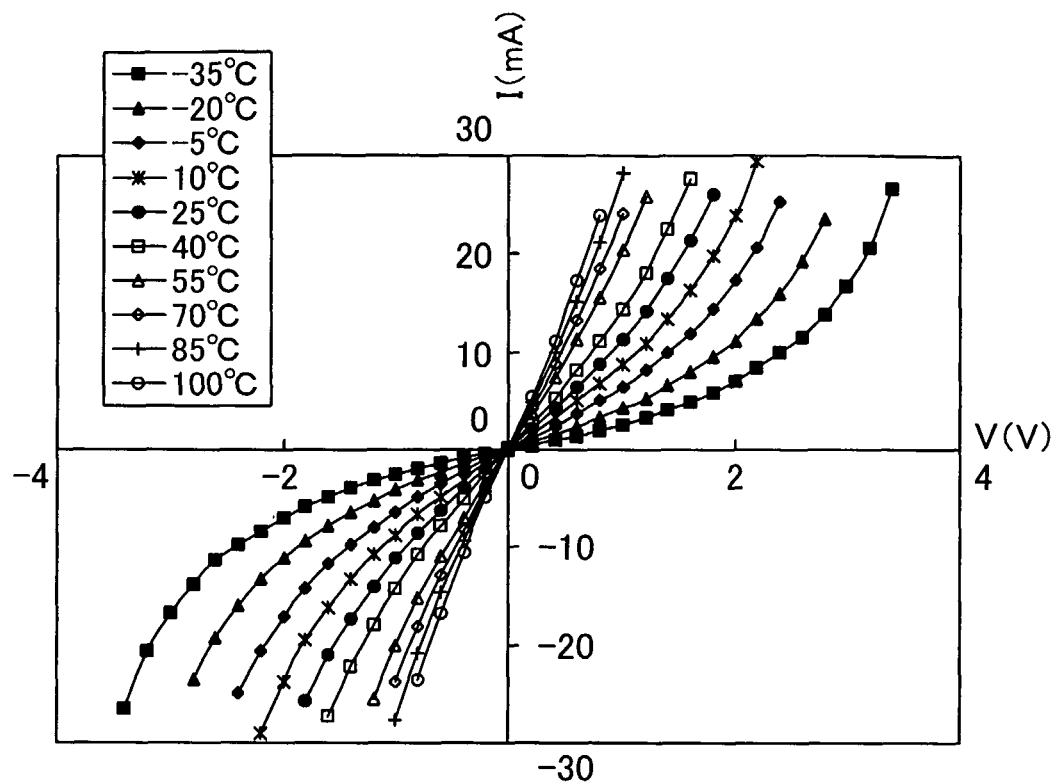
FIGS. 10A and 10B show current-voltage characteristics of a composite material of the present invention.

As to the laminated structure obtained thus in which ITSO, a mixed film of BBPB, molybdenum oxide, and rubrene, and Al are sequentially laminated over the substrate, measurement results of current-voltage characteristics at −35° C., −20° C., −5° C., 10° C., 25° C., 40° C., 55° C., 70° C., 85° C., and 100° C. are shown in FIG. 10A. Not the case where a potential of ITSO is higher than that of Al is regarded as forward bias.

Since almost the same amount of current flows both under forward bias and reverse bias, which is different from the above Comparative Example (FIG. 8A), it is found that an equivalent amount of holes is injected from both ITSO and Al. In addition, it is also found that a larger amount of current flows at low voltage as compared to the above Comparative Example.

Figure 10B:
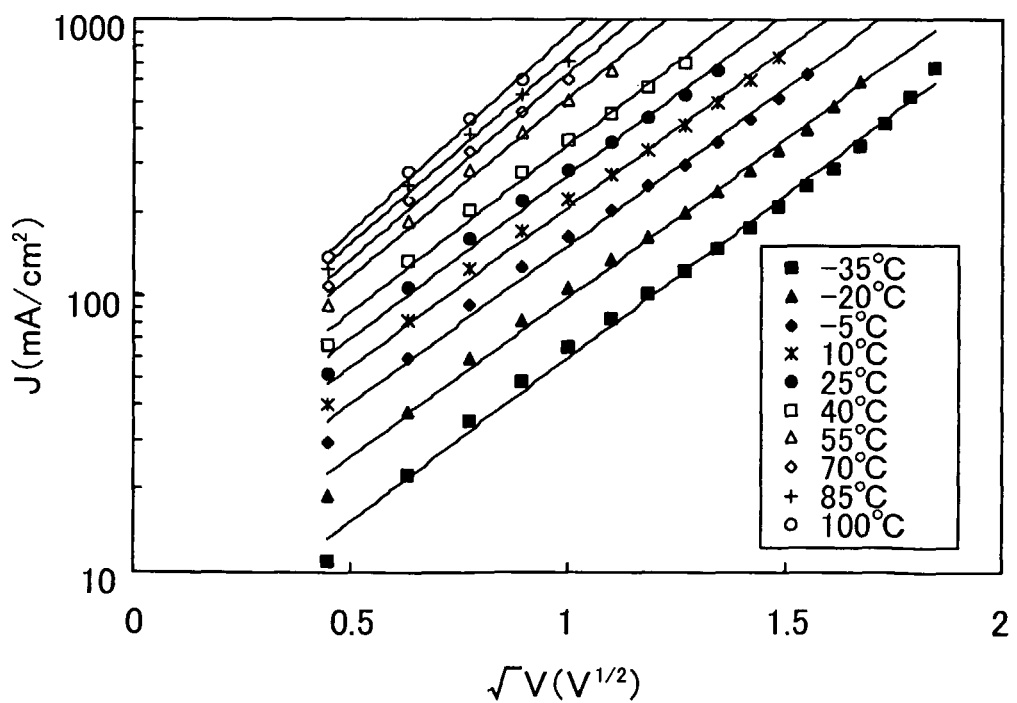

Subsequently, the current-voltage characteristics obtained in FIG. 10A were analyzed to see whether current flowing in this example is controlled by a Schottky injection mechanism (in other words, whether it is controlled by injection). First, under forward bias (in other words, at the time of hole injection from ITSO), $J_0$ at respective temperatures was found as in the above Comparative Example by replacing the horizontal axis of the current-voltage characteristics obtained in FIG. 10A with a square root of a voltage V, replacing the vertical axis with a logarithm of a current density J (see FIG. 10B), and extrapolating a plot (solid lines in the diagram) at respective temperatures. Subsequently, an Arrhenius plot was made according to Formula (8). A result thereof is shown in FIG. 11.

Figure 11:
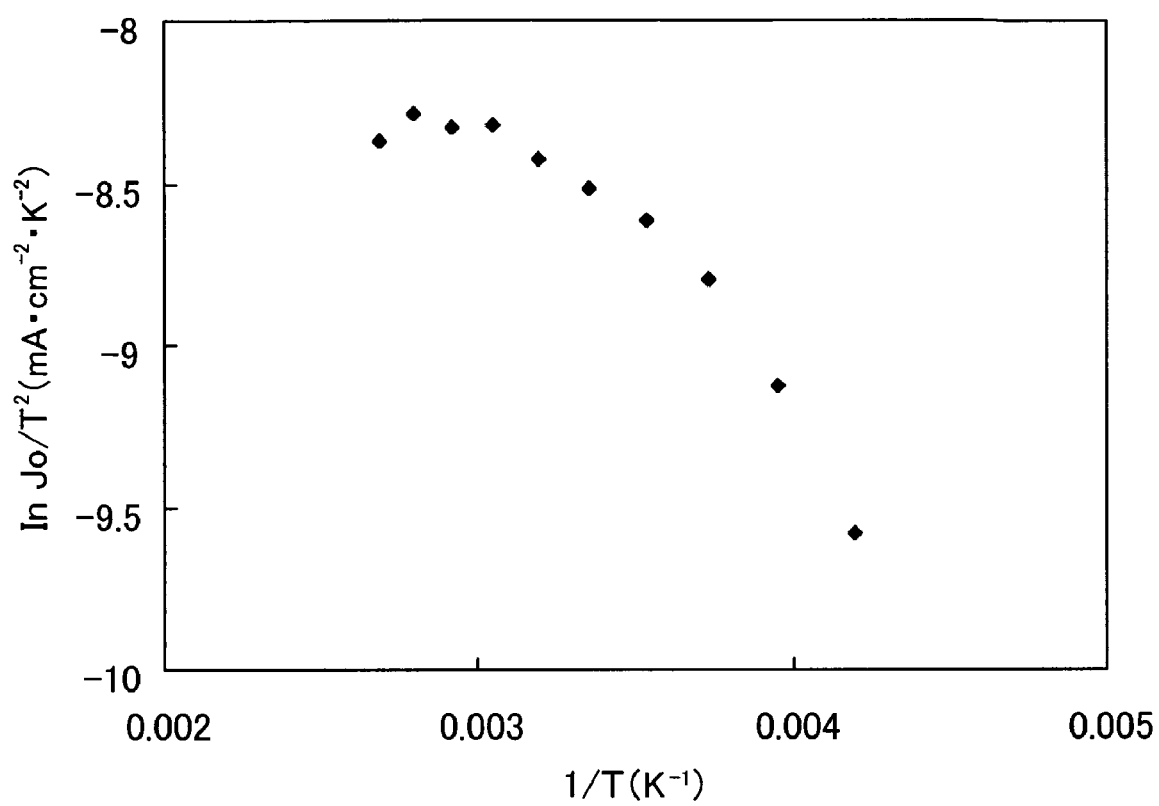
FIG. 11 shows an Arrhenius plot when current-voltage characteristics of a composite material of the present invention are assumed to be a Schottky injection mechanism.

As shown in FIG. 11, it is found that in the case of using the composite material of the invention, an Arrhenius plot of $J_0/T^2$ is not linear. This suggests that a Schottky injection mechanism is not dominant as to hole injection from ITSO into the composite material of the invention.

Thus, the current-voltage characteristics of the composite material of the invention were analyzed to see whether they followed Formula (1) described in Embodiment Mode 1. When it is set that $A\exp(-\phi_a/(2\ kT))=A'$ in Formula (1), Formula (1) can be expressed as the following Formula (9).

$$J = A'V + BV^n \quad (9)$$

However, A' is expressed by the following Formula (10)

$$A' = A\exp\left(\frac{-\phi_a}{2kT}\right) \quad (10)$$

Figure 12:
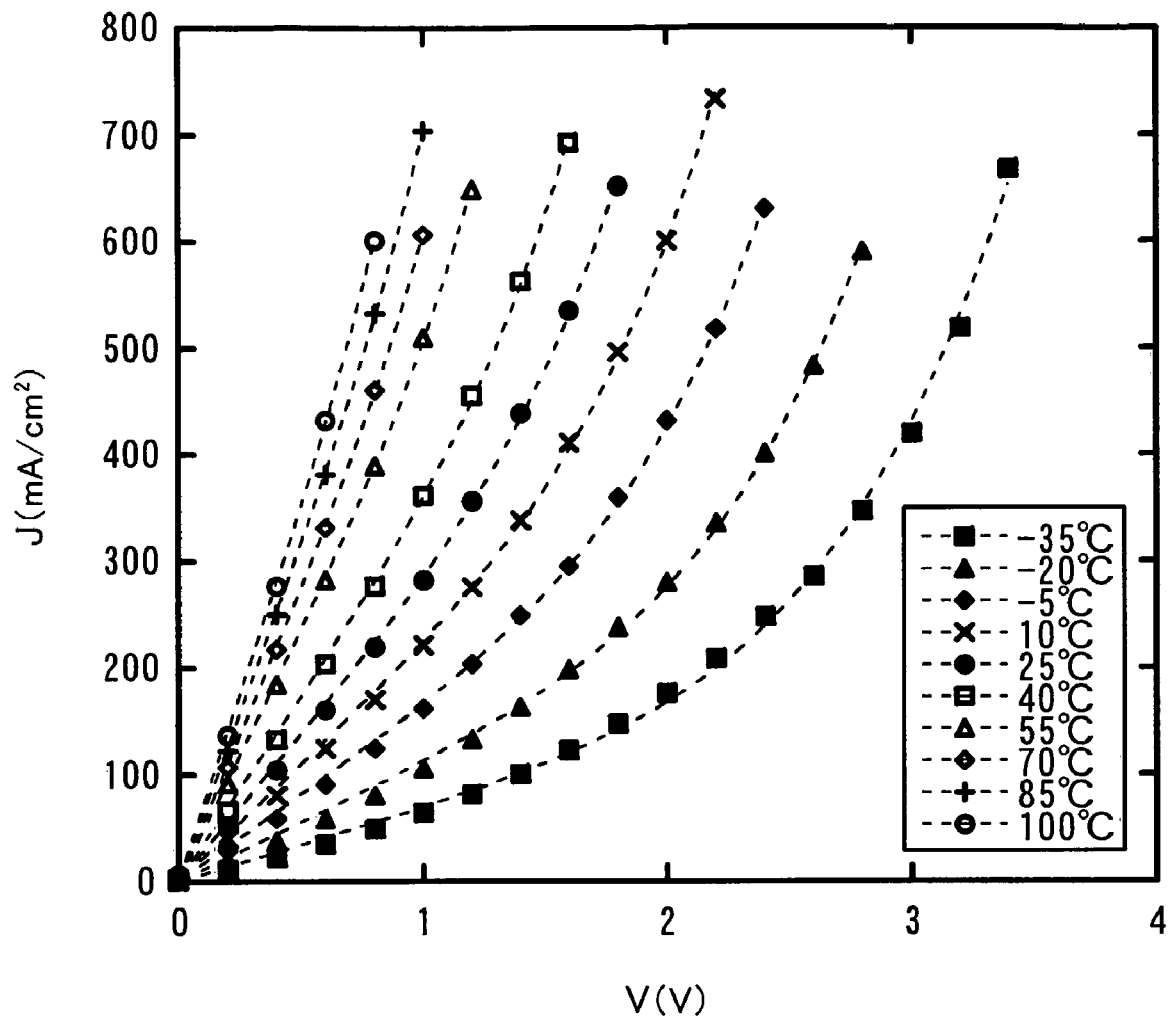
FIG. 12 is a diagram in which current-voltage characteristics of a composite material of the present invention is fitted by Formula (1).

A result of fitting the plot under forward bias in FIG. 10A by Formula (9) is shown in FIG. 12. Broken lines in the diagram show the fitting by Formula (9) in the case of n=5. As FIG. 12 shows, it is found that the fitting is performed with extremely precision. Values of A' found by this fitting at respective temperatures are shown in the following Table 2.

TABLE 2

| temperatures [° C.] | A'[mA/cm²/V] |
|---|---|
| −35 | $6.9 \times 10$ |
| −20 | $1.1 \times 10^2$ |
| −5 | $1.6 \times 10^2$ |
| 10 | $2.2 \times 10^2$ |
| 25 | $2.8 \times 10^2$ |
| 40 | $3.5 \times 10^2$ |
| 55 | $4.7 \times 10^2$ |
| 70 | $5.5 \times 10^2$ |
| 85 | $5.3 \times 10^2$ |
| 100 | $7.0 \times 10^2$ |

Here, since the following Formula (11) can be obtained according to Formula (10), A' is supposed to be linear when plotted on an Arrhenius plot. A result thereof is shown in FIG. 13.

$$\ln A' = \frac{-\phi_a}{2kT} + \ln A \quad (11)$$

Figure 13:
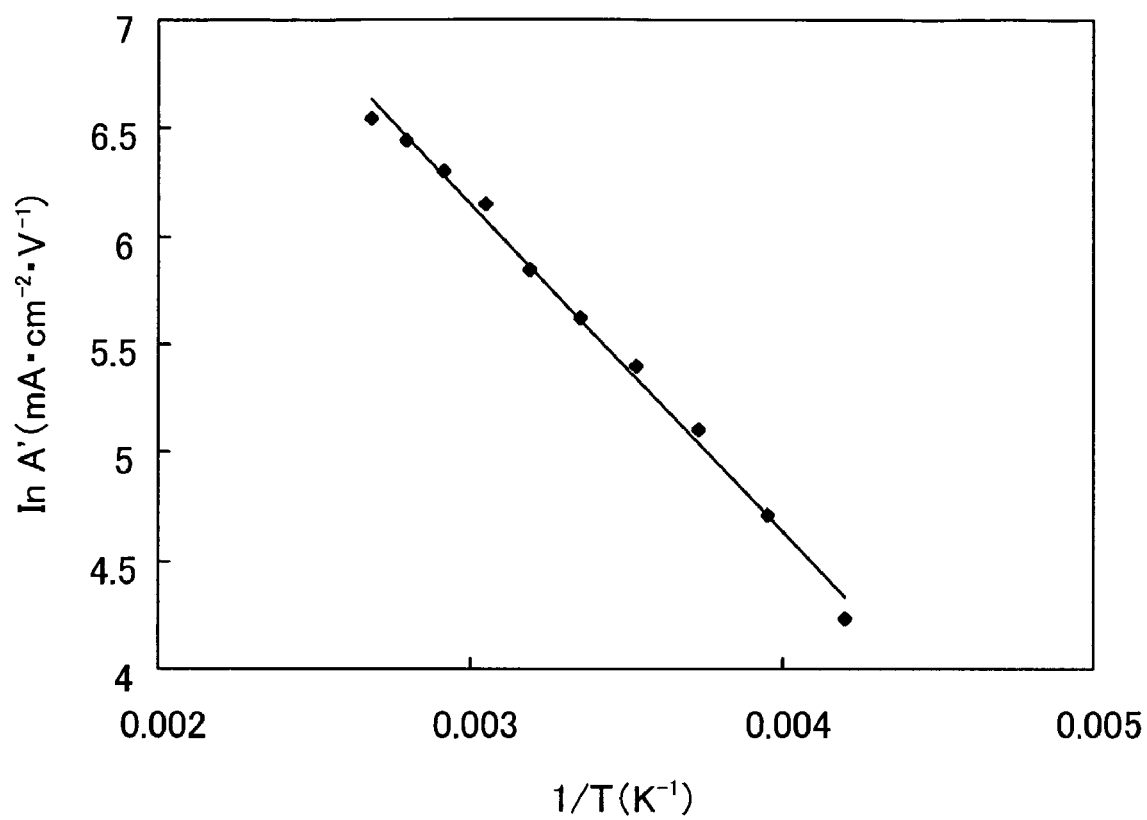
FIG. 13 shows an Arrhenius plot when current-voltage characteristics of a composite material of the present invention are assumed to follow Formula (1).

Since the Arrhenius plot shows linearity as shown in FIG. 13, it is found that an ohmic contact is formed as to hole injection from ITSO into the composite material of the invention and a current amount thereof follows Formula (1). Note that activation energy $\phi_a$ at this time is 0.26 eV.

Since almost the same amount of current as that under forward bias also flows under reverse bias, it is found that an ohmic contact is formed as to hole injection from Al into the composite material of the invention and a current amount thereof follows Formula (1).

Note that a work function of ITSO is 4.89 eV and that of Al is approximately 4 eV (each of which is measured using a photoelectron spectrometer AC-2 (manufactured by Riken Keiki Co., Ltd.)). According to the above, it is found that measured current-voltage characteristics of the composite material of the invention sandwiched between electrodes each having a work function of 3.5 eV to 5.5 eV follow Formula (1).

In addition, following Formula (1) allows the composite material of the invention to form an ohmic with the electrode and in addition, to conduct a large amount of current. Thus, a light emitting element in which the composite material of the invention is provided in contact with the electrode can reduce a drive voltage. In addition, general-purpose metal such as aluminum can be used for an anode.

Embodiment 3

Embodiment 3 exemplifies a composite material of the invention in which an organic compound is compounded with an inorganic compound showing an electron-accepting property to the organic compound. NPB having a hole transporting property was used as the organic compound, and molybdenum oxide was used as the inorganic compound.

First, a composite material of the invention in which NPB was compounded with molybdenum oxide was deposited by a co-evaporation method. At this time, NPB was evaporated at a deposition rate of 0.4 nm/s, and molybdenum oxide of a quarter (weight ratio) of the amount of NPB was evaporated. Therefore, a molar ratio of NPB to molybdenum oxide was 1:1. Note that a thickness thereof was 50 nm.

Figure 14:
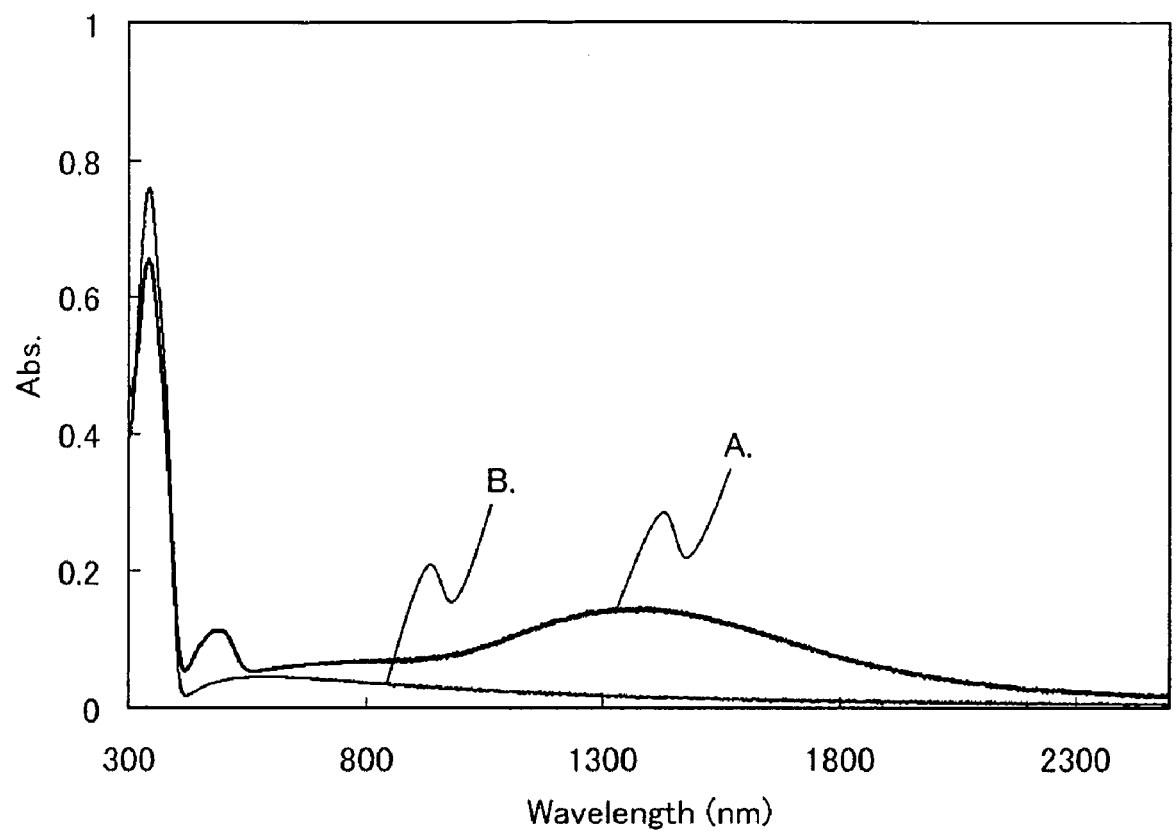
FIG. 14 shows an absorption spectrum of a composite material of the present invention.

A measurement result of an absorption spectrum of the composite material of NPB and molybdenum oxide which was deposited in this way is indicated by A. in FIG. 14. For comparison, an absorption spectrum of a film of only NPB (B. in the diagram) is also shown. An absorption spectrum of a film of only molybdenum oxide is omitted here since it is shown in FIG. 7 in Embodiment 1.

As FIG. 14 shows, new absorption, which was not seen in each layer of only NPB or molybdenum oxide, was observed in the composite material of A. at around 500 nm, 800 nm, and 1400 nm. It is thought that this is because NPB and molybdenum oxide transfer electrons, and molybdenum oxide accepts electrons from NPB and holes are generated in NPB. Accordingly, it is suggested that in the same manner as an impurity semiconductor doped with impurities at high concentration, the composite material of the invention can form an ohmic contact with various electrodes and can perform carrier transport like band conduction.

On the other hand, absorption at around 350 nm, which was also seen in the film of only NPB (B.), was observed in the composite material (A.). This suggests that the composite material of the invention still has a property of NPB, and can perform carrier transport by hopping conduction (trap-charge limited current).

Embodiment 4

Embodiment 4 exemplifies current-voltage characteristics of the composite material of the invention. First, current-voltage characteristics of the above-described film of only NPB are exemplified for comparison.

Comparative Example

First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, NPB was put in a resistance-heating evaporation source, and NPB was deposited under vacuum by a vacuum evaporation method. A thickness thereof was 200 nm. In addition, aluminum (Al) was deposited thereover with a thickness of 200 nm.

Figure 15A:
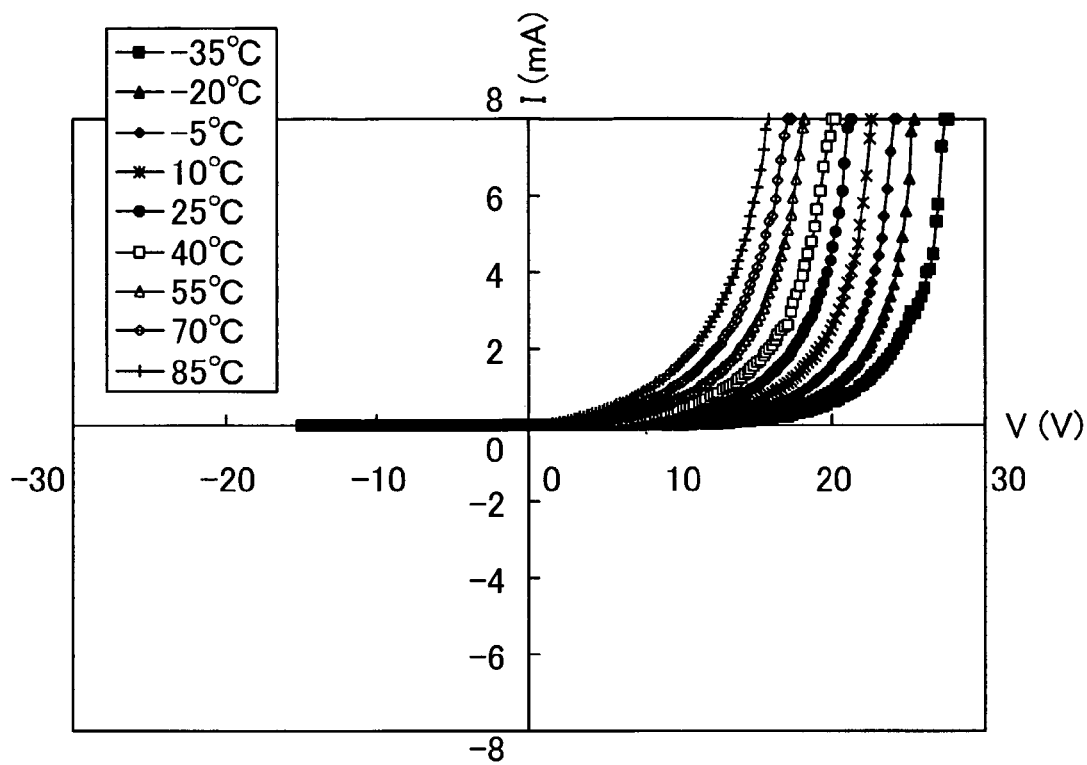
FIGS. 15A and 15B show current-voltage characteristics of Comparative Example.

As to the laminated structure thus obtained in which ITSO, NPB, and Al are sequentially laminated over the substrate, measurement results of current-voltage characteristics at −35° C., −20° C., −5° C., 10° C., 25° C., 40° C., 55° C., 70° C., and 85° C. are shown in FIG. 15A (data at 100° C. was not obtained since a glass transition point of NPB is slightly less than 100° C.). Note that the case where a potential of ITSO is higher than that of Al is regarded as forward bias.

Since current flows under forward bias as shown in FIG. 15A, it is found that holes are injected from ITSO. Further, since current does not flow and rectification is shown under reverse bias, it is suggested that holes are not injected from Al.

Figure 15B:
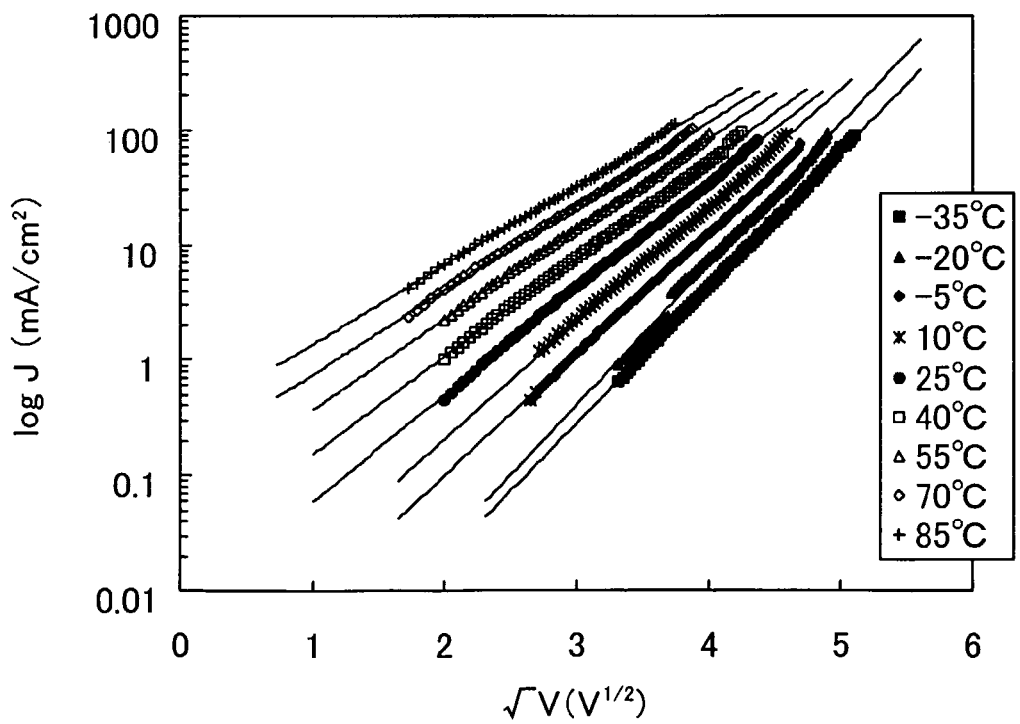

Subsequently, the current-voltage characteristics obtained in FIG. 15A were analyzed to see whether current flowing in Comparative Example was actually controlled by a Schottky injection mechanism (in other words, whether it is controlled by injection). A method of analysis is the same as that described in Embodiment 2. The y-intersect ($J_0$) at respective temperatures can be obtained by replacing the horizontal axis of the current-voltage characteristics obtained in FIG. 15A with a square root of a voltage V, replacing the vertical axis with a logarithm of a current density J (see FIG. 15B), and extrapolating a plot (solid lines in the diagram) at respective temperatures. It was determined if $J_0$ at respective temperatures followed Formula (8).

The obtained values of $J_0$ at respective temperatures are shown in the following Table 3. The values thus obtained of $J_0$ were used to make an Arrhenius plot according to Formula (8), and a result thereof is shown in FIG. 16.

TABLE 3

| temperatures [° C.] | $J_0[mA/cm^2]$ |
|---|---|
| −35 | $8.0 \times 10^{-5}$ |
| −20 | $9.0 \times 10^{-5}$ |
| −5 | $8.0 \times 10^{-4}$ |
| 10 | $1.9 \times 10^{-3}$ |
| 25 | $7.2 \times 10^{-3}$ |
| 40 | $2.2 \times 10^{-2}$ |
| 55 | $6.2 \times 10^{-2}$ |
| 70 | $1.4 \times 10^{-1}$ |
| 85 | $2.8 \times 10^{-1}$ |

Figure 16:
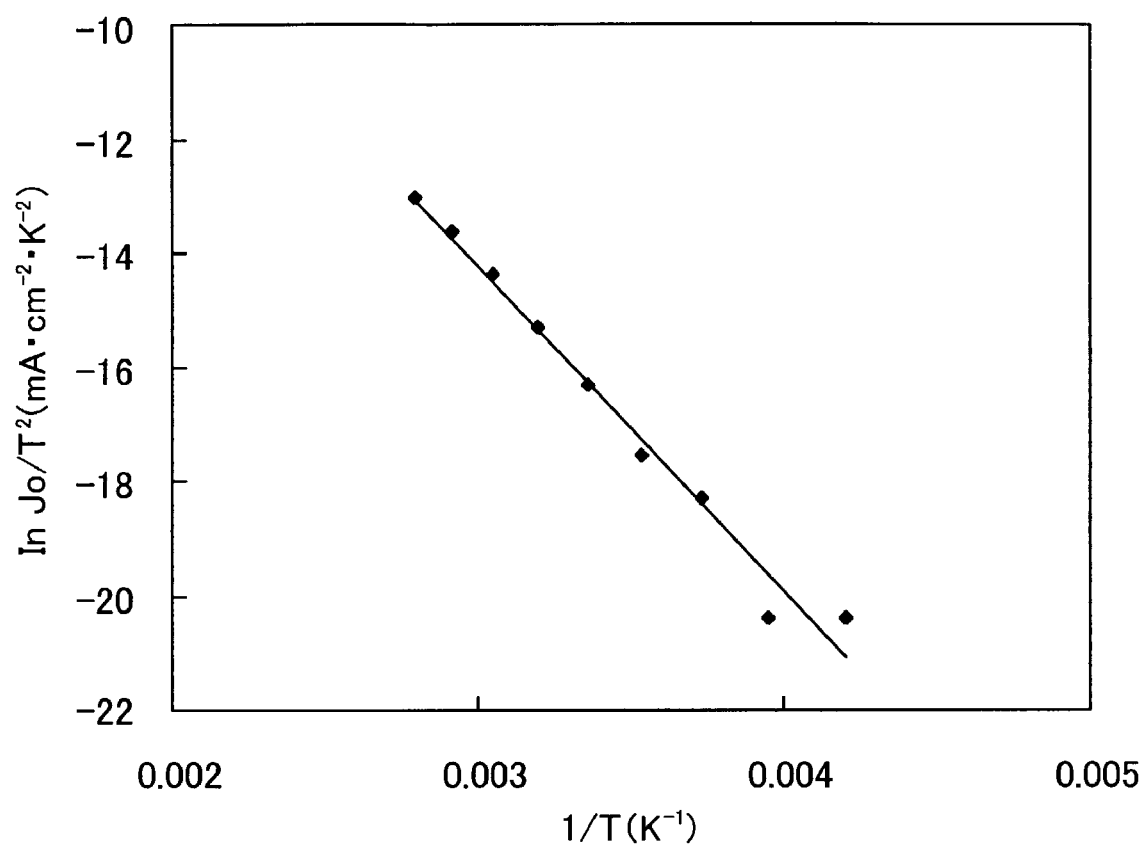
FIG. 16 shows an Arrhenius plot when Comparative Example is assumed to be a Schottky injection mechanism.

Since the Arrhenius plot shows linearity as shown in FIG. 16, it is suggested that hole injection from ITSO into NPB is a Schottky injection mechanism. In addition, it is also found that the Schottky injection controls a current amount. Note that a Schottky barrier $\phi_B$ is found from the slope in FIG. 16 to be 0.49 eV.

Example

Subsequently, current-voltage characteristics of the composite material of the invention are exemplified. First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, NPB, molybdenum oxide (VI), and rubrene were separately put in different resistance-heating evaporation sources, and the composite material of the invention formed from NPB, molybdenum oxide, and rubrene was deposited under vacuum by a co-evaporation method. At this time, NPB was evaporated at a deposition rate of 0.2 nm/s and an adjustment was performed so that NPB: molybdenum oxide: rubrene becomes 2:0.75:0.04 (mass ratio). A thickness thereof was 200 nm to correspond to Comparative Example. Further, aluminum (Al) was deposited thereover with a thickness of 200 nm. Note that rubrene was added as a stabilizer of film quality, which is not necessarily required.

Figure 17A:
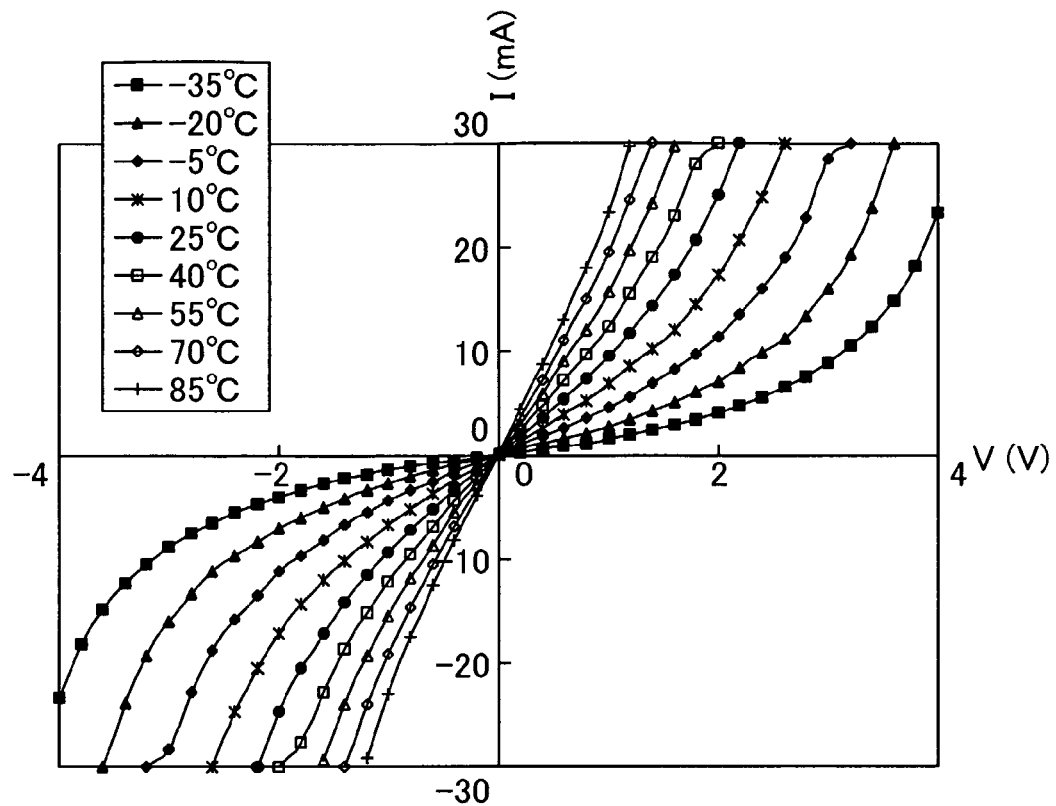
FIGS. 17A and 17B show current-voltage characteristics of a composite material of the present invention.

As to the laminated structure obtained thus in which ITSO, a mixed film of NPB, molybdenum oxide, and rubrene, and Al are sequentially laminated over the substrate, measurement results of current-voltage characteristics at −35° C., −20° C., −5° C., 10° C., 25° C., 40° C., 55° C., 70° C., and 85° C. are shown in FIG. 17A. Note that the case where a potential of ITSO is higher than that of Al is regarded as forward bias.

Since almost the same amount of current flows both under forward bias and reverse bias, which is different from the above Comparative Example (FIG. 15A), it is found that an equivalent amount of holes is injected from both ITSO and Al. In addition, it is also found that a larger amount of current flows at low voltage as compared to the above Comparative Example.

Figure 17B:
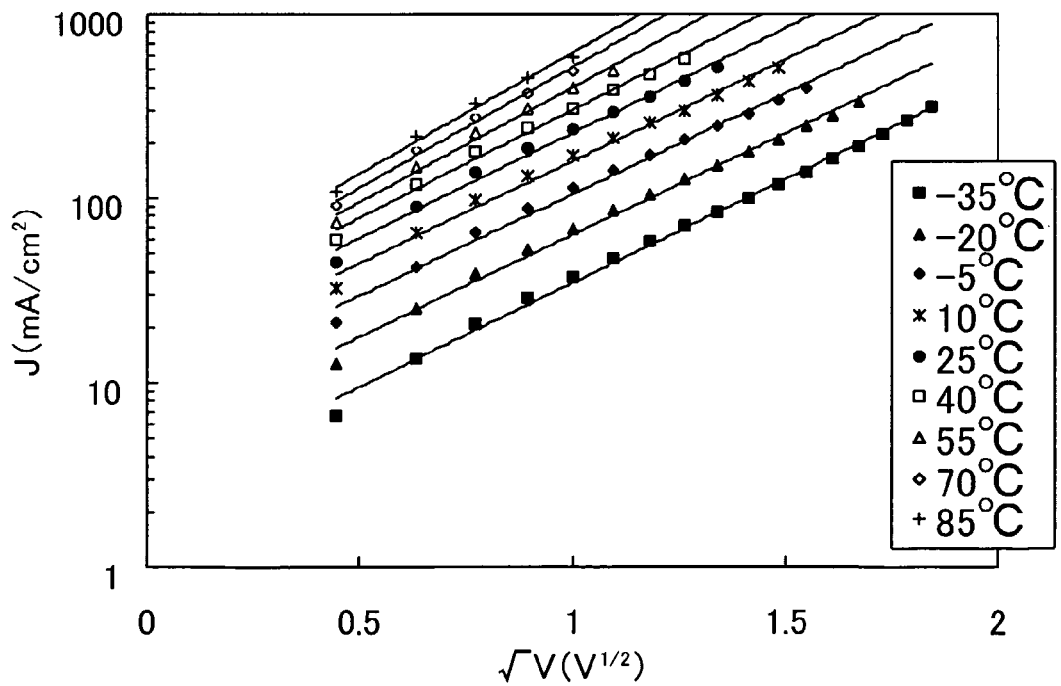

Subsequently, the current-voltage characteristics obtained in FIG. 17A were analyzed to see whether current flowing in this example was controlled by a Schottky injection mechanism (in other words, whether it is controlled by injection). First, under forward bias (in other words, at the time of hole injection from ITSO), $J_0$ was found as in the above Comparative Example by replacing the horizontal axis of the current-voltage characteristics obtained in FIG. 17A with a square root of a voltage V, replacing the vertical axis with a logarithm of a current density J (see FIG. 17B), and extrapolating a plot (solid lines in the diagram) at respective temperatures. Subsequently, an Arrhenius plot was made according to Formula (8). A result thereof is shown in FIG. 18.

Figure 18:
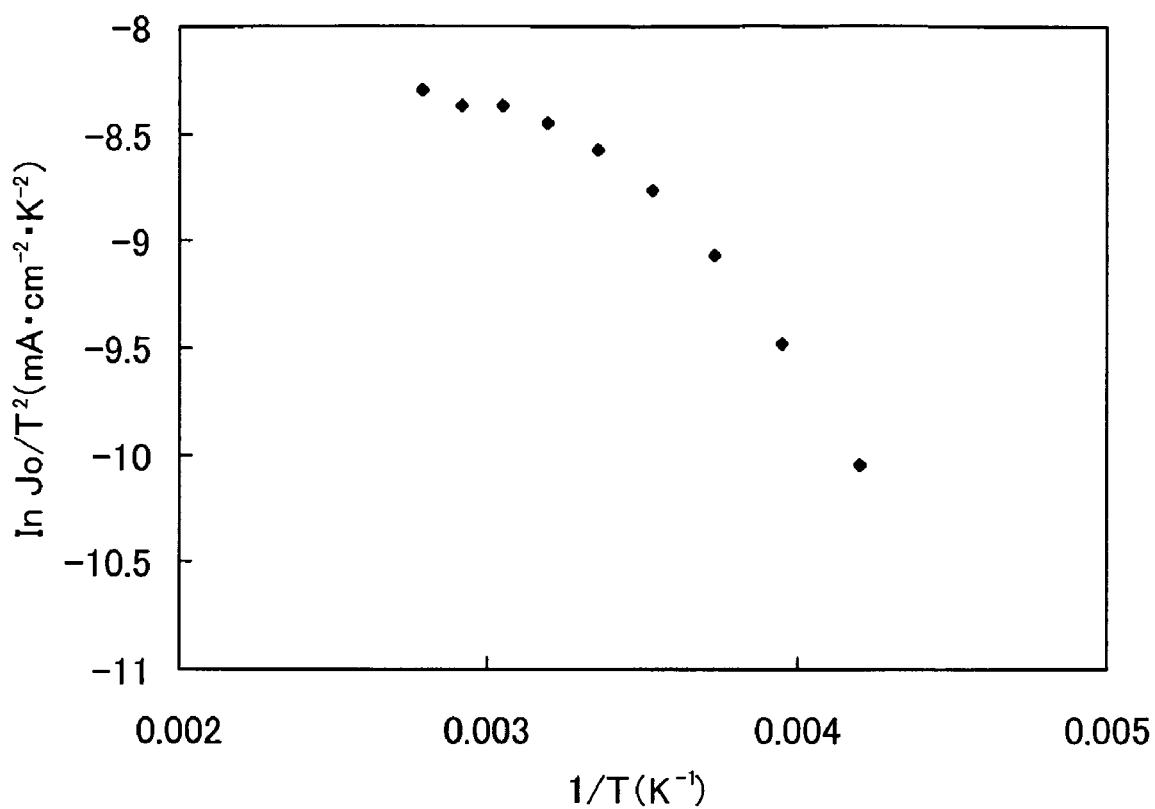
FIG. 18 shows an Arrhenius plot when current-voltage characteristics of a composite material of the present invention are assumed to be a Schottky injection mechanism.

As shown in FIG. 18, it is found that in the case of using the composite material of the invention, an Arrhenius plot of $J_0/T^2$ is not linear. This suggests that a Schottky injection mechanism is not dominant as to hole injection from ITSO into the composite material of the invention.

Thus, the current-voltage characteristics of the composite material of the invention were analyzed to see whether they followed Formula (1) described in Embodiment Mode 1. A method of analysis is the same as that described in Embodiment 2. The plot under forward bias in FIG. 17A was fitted by Formula (9) to find A' at respective temperatures, and it was determined if A' followed Formula (11).

Figure 19:
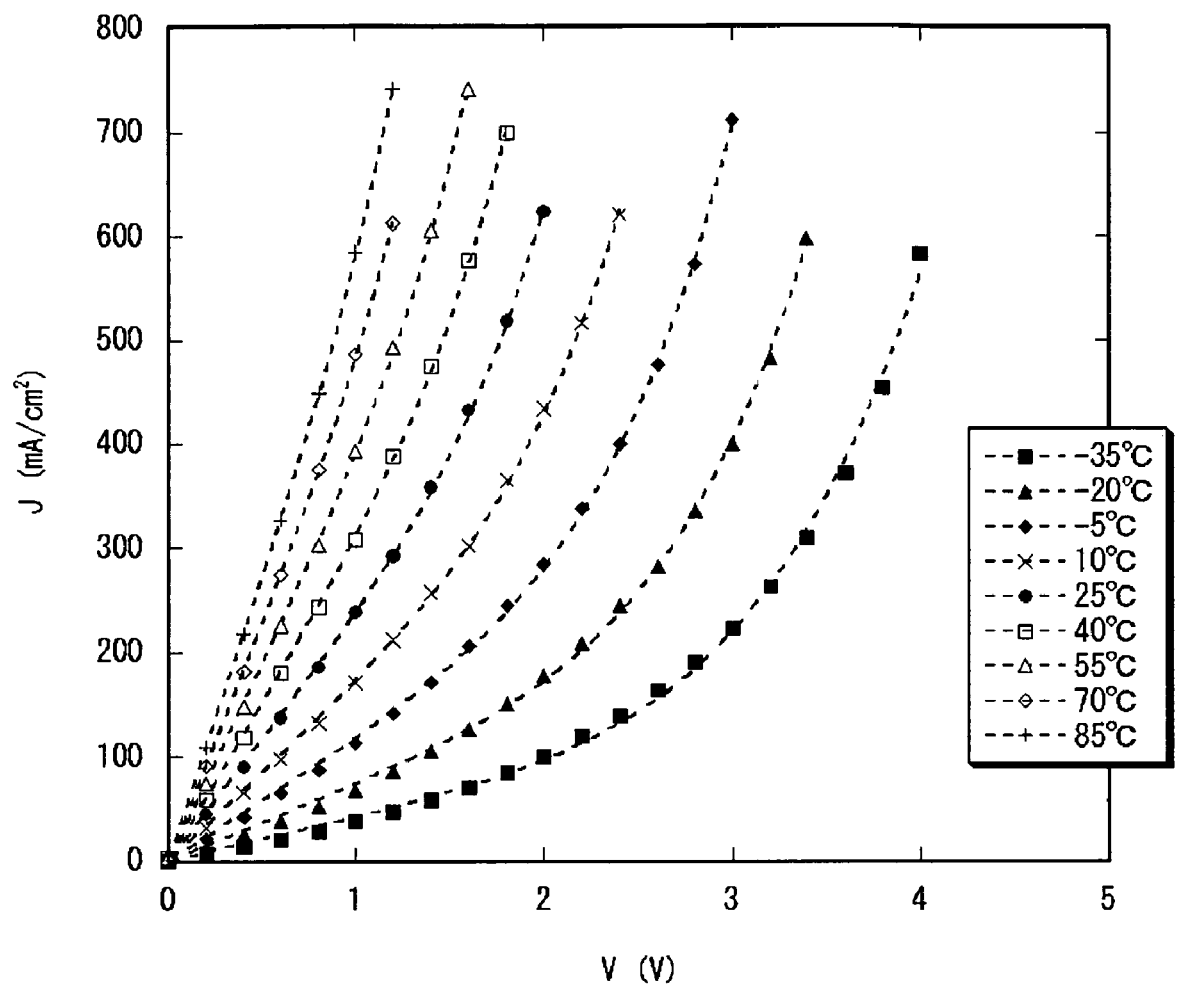
FIG. 19 is a diagram in which current-voltage characteristics of a composite material of the present invention is fitted by Formula (1).

A result of fitting the plot under forward bias in FIG. 17A by Formula (9) is shown in FIG. 19. Broken lines in the diagram show the fitting by Formula (9) in the case of n=5. As FIG. 19 shows, it is found that the fitting is performed with extreme precision. Values of A' found by this fitting at respective temperatures are shown in the following Table 4.

TABLE 4

| temperatures [° C.] | A'[mA/cm$^2$/V] |
|---|---|
| −35 | $4.2 \times 10$ |
| −20 | $7.4 \times 10$ |
| −5 | $1.2 \times 10^2$ |
| 10 | $1.7 \times 10^2$ |
| 25 | $2.3 \times 10^2$ |
| 40 | $3.0 \times 10^2$ |
| 55 | $3.8 \times 10^2$ |
| 70 | $4.6 \times 10^2$ |
| 85 | $5.5 \times 10^2$ |

Figure 20:
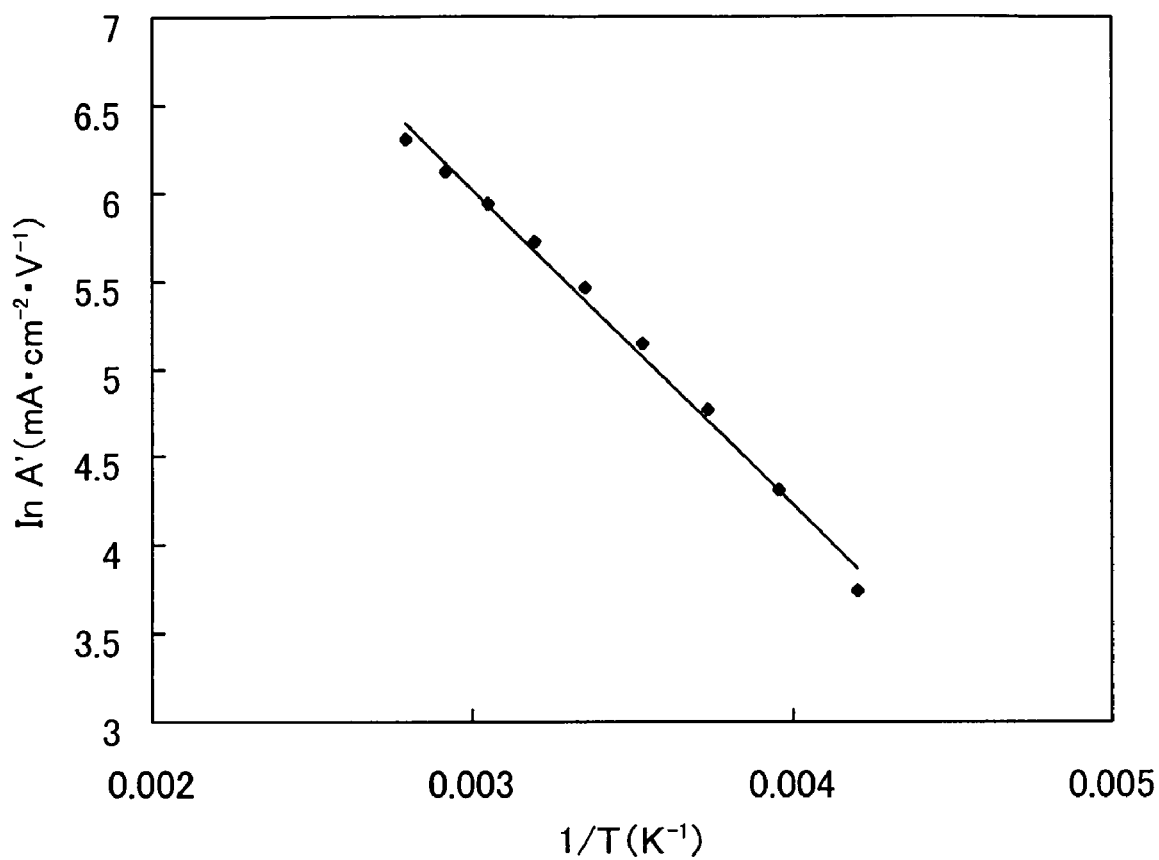
FIG. 20 shows an Arrhenius plot when current-voltage characteristics of a composite material of the present invention are assumed to follow Formula (1).

A result of making an Arrhenius plot of A' is shown in FIG. 20. Since the Arrhenius plot shows linearity as shown in FIG. 20, it is found that an ohmic contact is formed as to hole injection from ITSO into the composite material of the invention and a current amount thereof follows Formula (1). Note that activation energy $\phi_a$ at this time is 0.31 eV.

Since almost the same amount of current as that under forward bias also flows under reverse bias, it is found that an ohmic contact is formed as to hole injection from Al into the composite material of the invention and a current amount thereof follows Formula (1).

Note that a work function of ITSO is 4.89 eV and that of Al is approximately 4 eV (each of which is measured using a photoelectron spectrometer AC-2 (manufactured by Riken Keiki Co., Ltd.)). According to the above, it is found that measured current-voltage characteristics of the composite material of the invention sandwiched between electrodes each having a work function of 3.5 eV to 5.5 eV follow Formula (1).

In addition, following Formula (1) allows the composite material of the invention to have an ohmic with the electrode and in addition, to conduct a large amount of current. Thus, a light emitting element in which the composite material of the invention is provided in contact with the electrode can reduce a drive voltage. In addition, general-purpose metal, which does not have a high work function, such as aluminum can be used for an anode.

Embodiment 5

Embodiment 5 exemplifies a composite material of the invention in which an organic compound is compounded with an inorganic compound showing an electron-accepting property to the organic compound. DNTPD having a hole transporting property was used as the organic compound, and molybdenum oxide was used as the inorganic compound.

First, a composite material of the invention in which DNTPD was compounded with molybdenum oxide was deposited by a co-evaporation method as in Embodiment 1. At this time, DNTPD was evaporated at a deposition rate of 0.4 nm/s, and molybdenum oxide of a quarter (weight ratio) of the amount of DNTPD was evaporated. Therefore, a molar ratio of DNTPD to molybdenum oxide was 1:1.5. Note that a thickness thereof was 50 nm.

Figure 21:
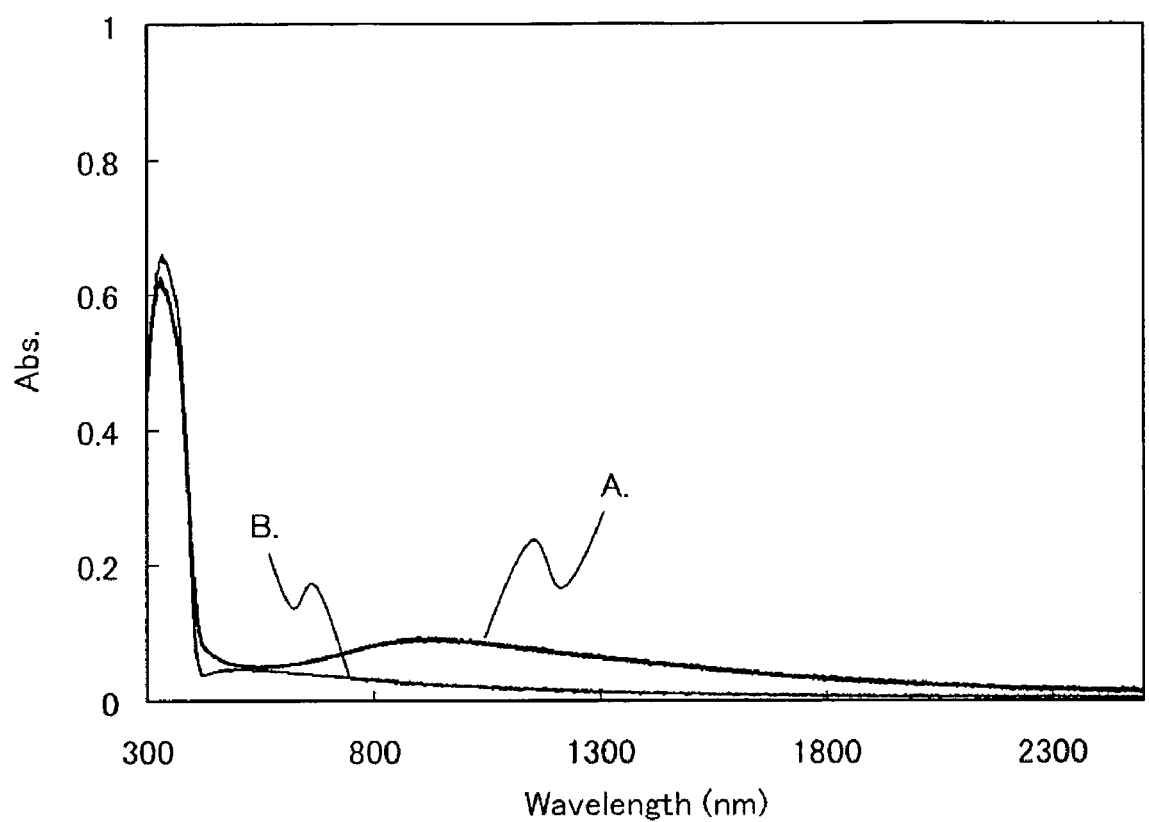
FIG. 21 shows an absorption spectrum of a composite material of the present invention.

A measurement result of an absorption spectrum of the composite material of DNTPD and molybdenum oxide which was deposited in this way is indicated by A. in FIG. 21. For comparison, an absorption spectrum of a film of only DNTPD (B. in the diagram) is also shown. An absorption spectrum of a film of only molybdenum oxide is omitted here since it is shown in FIG. 7 in Embodiment 1.

As FIG. 21 shows, new absorption, which was not seen in each layer of only DNTPD or molybdenum oxide, was observed in the composite material of A. at around 900 nm. It is thought that this is because DNTPD and molybdenum oxide transfer electrons, and molybdenum oxide accepts electrons from DNTPD and holes are generated in DNTPD. Accordingly, it is suggested that in the same manner as an impurity semiconductor doped with impurities at high concentration, the composite material of the invention can form an ohmic contact with various electrodes and can perform carrier transport like band conduction.

On the other hand, absorption at around 350 nm, which was also seen in the film of only DNTPD (B.), was observed in the composite material (A.). This suggests that the composite material of the invention still has a property of DNTPD, and can perform carrier transport by hopping conduction (trap-charge limited current).

Embodiment 6

Embodiment 6 exemplifies current-voltage characteristics of the composite material of the invention. First, current-voltage characteristics of the above-described film of only DNTPD are exemplified for comparison.

Comparative Example

First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, DNTPD was put in a resistance-heating evaporation source, and DNTPD was deposited under vacuum by a vacuum evaporation method. A thickness thereof was 200 nm. In addition, aluminum (Al) was deposited thereover with a thickness of 200 nm.

Figure 22A:
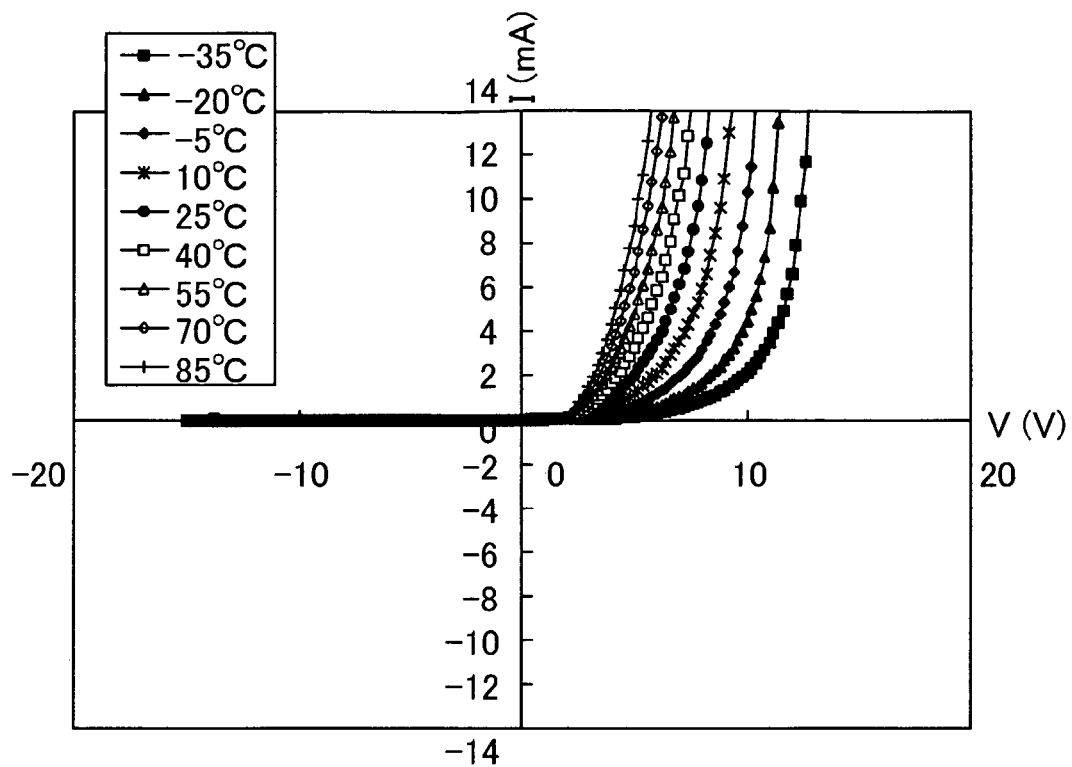
FIGS. 22A and 22B show current-voltage characteristics of Comparative Example.

As to the laminated structure thus obtained in which ITSO, DNTPD, and Al are sequentially laminated over the substrate, measurement results of current-voltage characteristics at −35° C., −20° C., −5° C., 10° C., 25° C., 40° C., 55° C., 70° C., and 85° C. are shown in FIG. 22A (data at 100° C. was not obtained since a glass transition point of DNTPD is slightly less than 100° C.). Note that the case where a potential of ITSO is higher than that of Al is regarded as forward bias.

Since current flows under forward bias as shown in FIG. 22A, it is found that holes are injected from ITSO. Further, since current does not flow and rectification is shown under reverse bias, it is suggested that holes are not injected from Al.

Figure 22B:
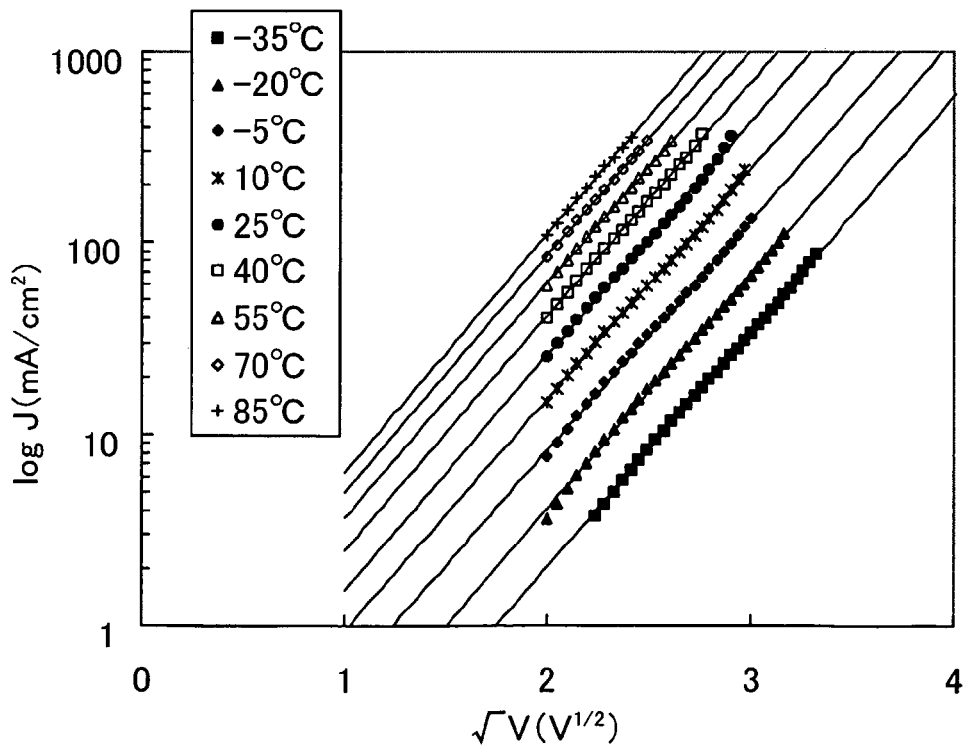

Subsequently, the current-voltage characteristics obtained in FIG. 22A were analyzed to see whether current flowing in Comparative Example was actually controlled by a Schottky injection mechanism (in other words, whether it is controlled by injection). A method of analysis is the same as that described in Embodiment 2. The y-intersect ($J_0$) at respective temperatures was obtained by replacing the horizontal axis of the current-voltage characteristics obtained in FIG. 22A with a square root of a voltage V, replacing the vertical axis with a logarithm of a current density J (see FIG. 22B), and extrapolating a plot (solid lines in the diagram) at respective temperatures. It was determined if $J_0$ at respective temperatures followed Formula (8).

The obtained values of $J_0$ at respective temperatures are shown in the following Table 5. The values thus obtained of $J_0$ were used to make an Arrhenius plot according to Formula (8), and a result thereof is shown in FIG. 23.

TABLE 5

| temperatures [° C.] | $J_0$[mA/cm$^2$] |
|---|---|
| −35 | $7.1 \times 10^{-3}$ |
| −20 | $1.4 \times 10^{-2}$ |
| −5 | $3.2 \times 10^{-2}$ |
| 10 | $5.8 \times 10^{-2}$ |
| 25 | $9.0 \times 10^{-2}$ |
| 40 | $1.5 \times 10^{-1}$ |
| 55 | $2.2 \times 10^{-1}$ |
| 70 | $2.9 \times 10^{-1}$ |
| 85 | $3.6 \times 10^{-1}$ |

Figure 23:
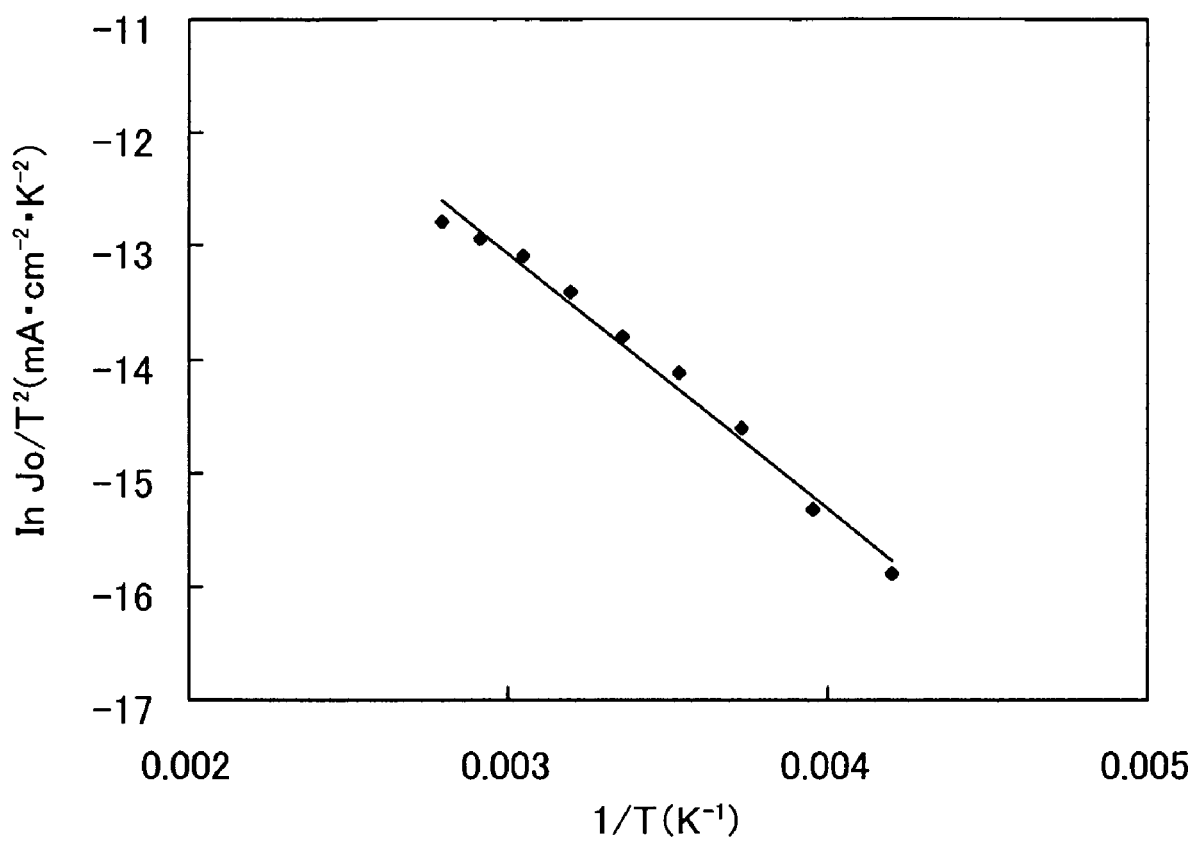
FIG. 23 shows an Arrhenius plot when Comparative Example is assumed to be a Schottky injection mechanism.

Since the Arrhenius plot shows linearity as shown in FIG. 23, it is suggested that hole injection from ITSO into DNTPD is a Schottky injection mechanism. In addition, it is also found that the Schottky injection controls a current amount. Note that a Schottky barrier $\phi_B$ is found from the slope in FIG. 23 to be 0.20 eV.

Example

Subsequently, current-voltage characteristics of the composite material of the invention are exemplified. First, a glass substrate, over which ITSO was deposited with a thickness of 110 nm, was prepared. The periphery of ITSO was covered with an insulating film so that a portion of the ITSO surface with a size of 2 mm square was exposed.

Next, the glass substrate was fixed to a substrate holder in a vacuum evaporation apparatus so that the side provided with ITSO faced downward. Then, DNTPD and molybdenum oxide (VI) were separately put in different resistance-heating evaporation sources, and the composite material of the invention formed form DNTPD and molybdenum oxide was deposited under vacuum by a co-evaporation method. At this time, DNTPD was evaporated at a deposition rate of 0.2 nm/s and an adjustment was performed so that DNTPD: molybdenum oxide was 2:1 (mass ratio). A thickness thereof was 200 nm to correspond to Comparative Example. Further, aluminum (Al) was deposited thereover with a thickness of 200 nm.

Figure 24A:
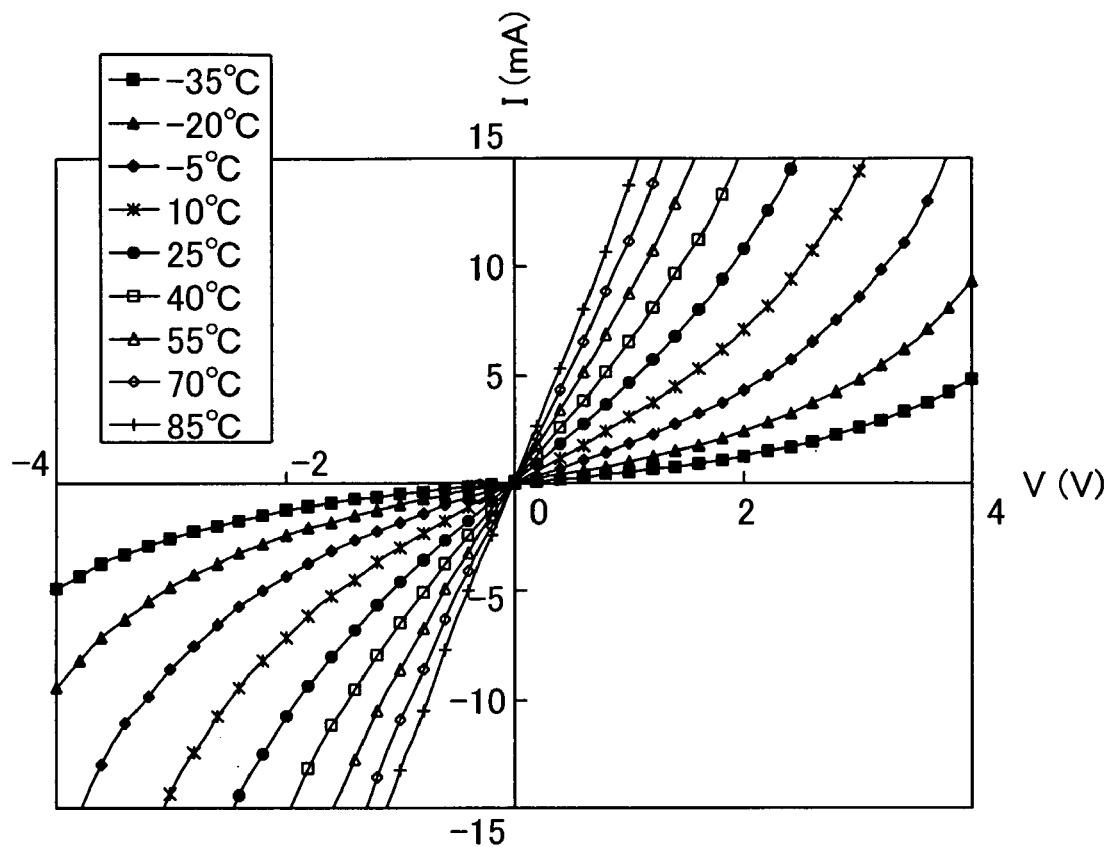
FIGS. 24A and 24B show current-voltage characteristics of a composite material of the present invention.

As to the laminated structure obtained thus in which ITSO, a mixed film of DNTPD and molybdenum oxide, and Al are sequentially laminated over the substrate, measurement results of current-voltage characteristics at −35° C., −20° C., −5° C., 10° C., 25° C., 40° C., 55° C., 70° C., and 85° C. are shown in FIG. 24A. Note that the case where a potential of ITSO is higher than that of Al is regarded as forward bias.

Since almost the same amount of current flows both under forward bias and reverse bias, which is different from the above Comparative Example (FIG. 22A), it is found that an equivalent amount of holes is injected from both ITSO and Al. In addition, it is also found that a larger amount of current flows at low voltage as compared to the above Comparative Example.

Figure 24B:
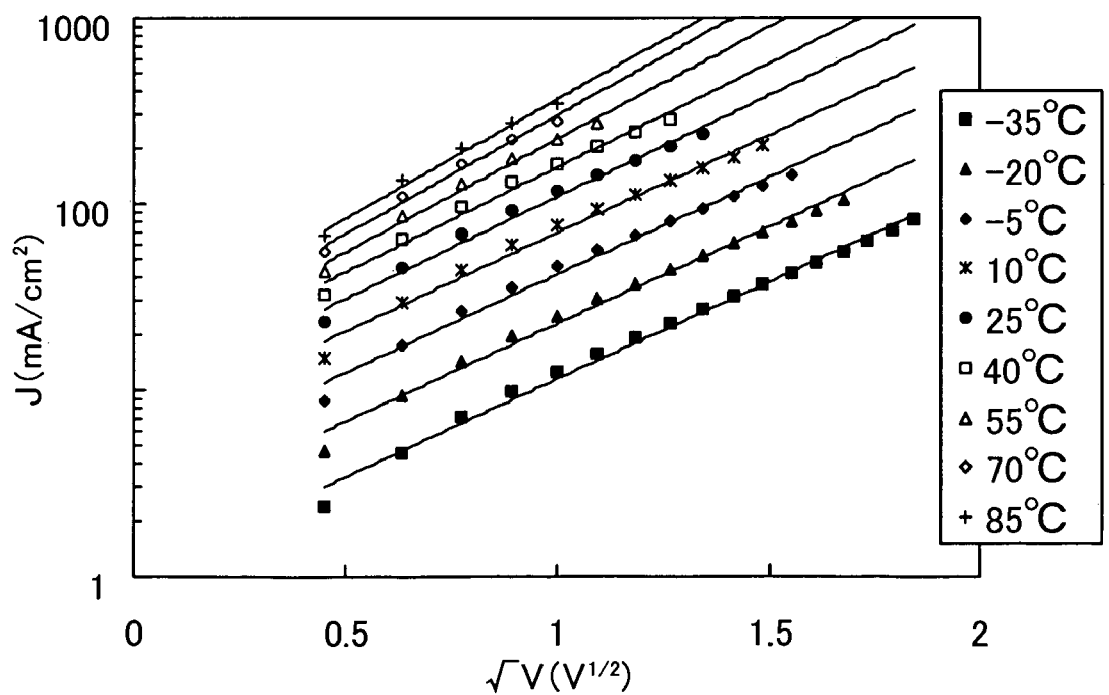

Subsequently, the current-voltage characteristics obtained in FIG. 24A were analyzed to see whether current flowing in this example was controlled by a Schottky injection mechanism (in other words, whether it is controlled by injection). First, under forward bias (in other words, at the time of hole injection from ITSO), $J_0$ was found as in the above Comparative Example by replacing the horizontal axis of the current-voltage characteristics obtained in FIG. 24A with a square root of a voltage V, replacing the vertical axis with a logarithm of a current density J (see FIG. 24B), and extrapolating a plot (solid lines in the diagram) at respective temperatures. Subsequently, an Arrhenius plot was made according to Formula (8). A result thereof is shown in FIG. 25.

Figure 25:
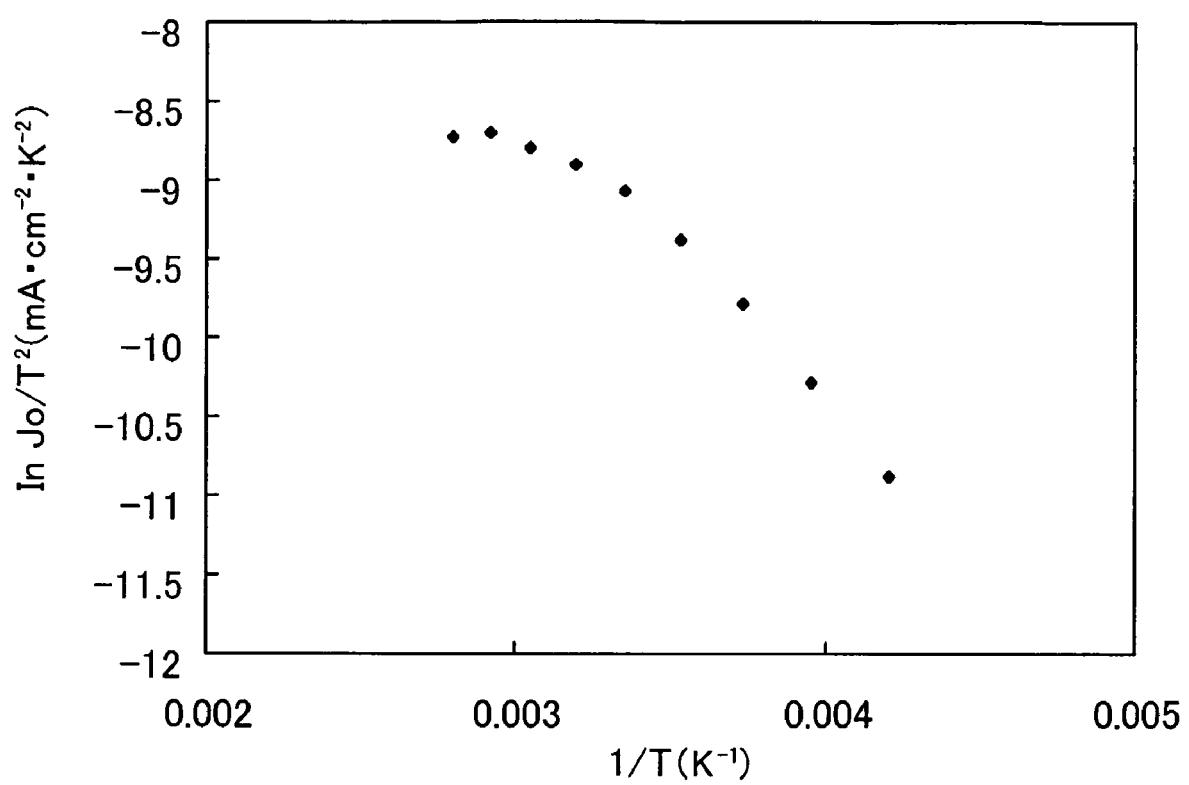
FIG. 25 shows an Arrhenius plot when current-voltage characteristics of a composite material of the present invention are assumed to be a Schottky injection mechanism.

As shown in FIG. 25, it is found that in the case of using the composite material of the invention, an Arrhenius plot of $J_0/T^2$ is not linear. This suggests that a Schottky injection mechanism is not dominant as to hole injection from ITSO into the composite material of the invention.

Thus, the current-voltage characteristics of the composite material of the invention were analyzed to see whether they followed Formula (1) described in Embodiment Mode 1. A method of analysis is the same as that described in Embodiment 2. The plot under forward bias in FIG. 24A was fitted by Formula (9) to find A' at respective temperatures, and it was determined if A' followed Formula (11).

Figure 26:
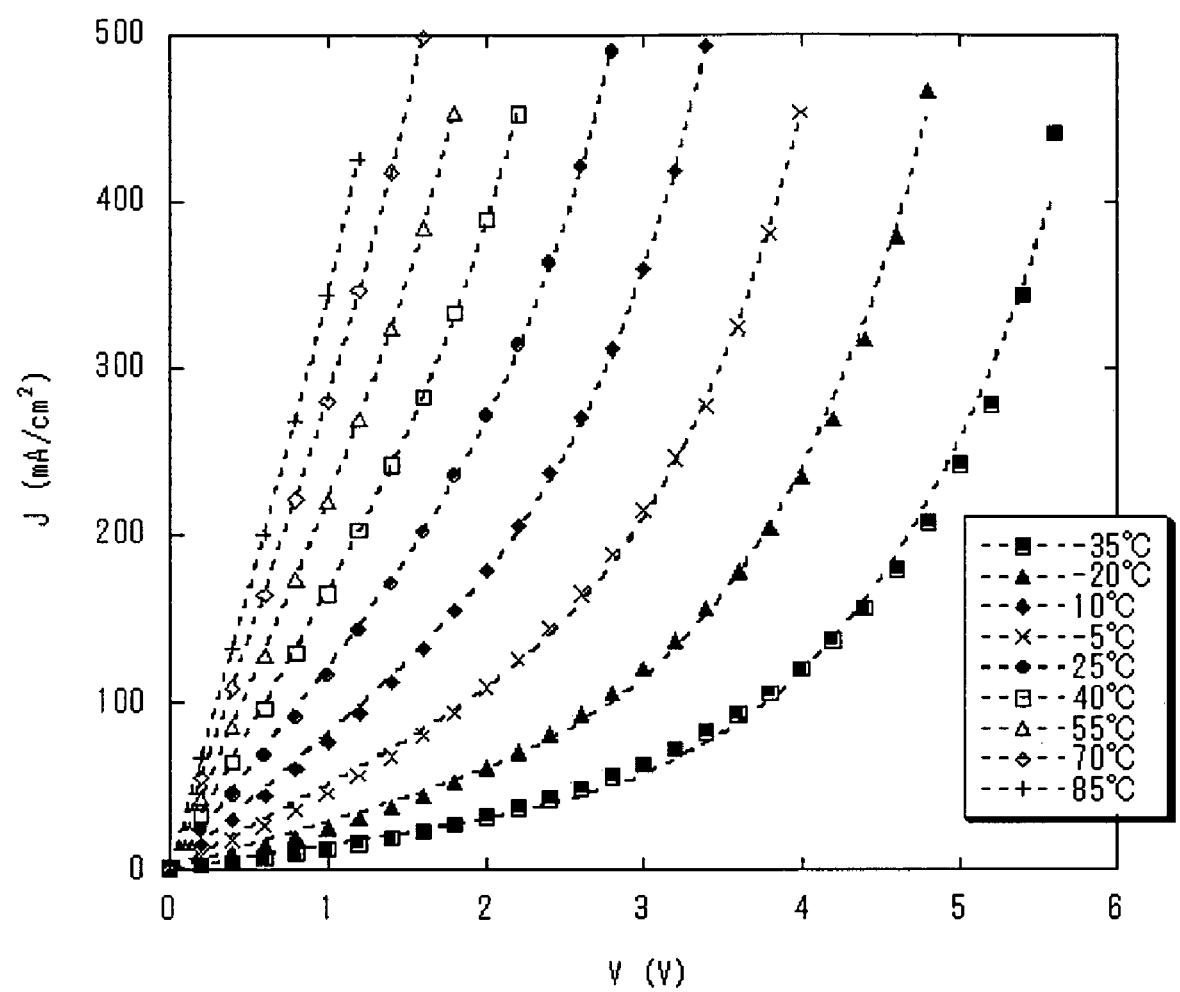
FIG. 26 is a diagram in which current-voltage characteristics of a composite material of the present invention is fitted by Formula (1).

A result of fitting the plot under forward bias in FIG. 24A by Formula (9) is shown in FIG. 26. Broken lines in the diagram show the fitting by Formula (9) in the case of n=5. As FIG. 26 shows, it is found that the fitting is performed with extreme precision. Values of A' found by this fitting at respective temperatures are shown in the following Table 6.

TABLE 6

| temperatures [° C.] | A'[mA/cm$^2$/V] |
|---|---|
| −35 | 1.4 × 10 |
| −20 | 2.8 × 10 |
| −5 | 8.1 × 10$^2$ |
| 10 | 5.0 × 10$^2$ |
| 25 | 1.2 × 10$^2$ |
| 40 | 1.6 × 10$^2$ |
| 55 | 2.2 × 10$^2$ |
| 70 | 2.7 × 10$^2$ |
| 85 | 3.3 × 10$^2$ |

Figure 27:
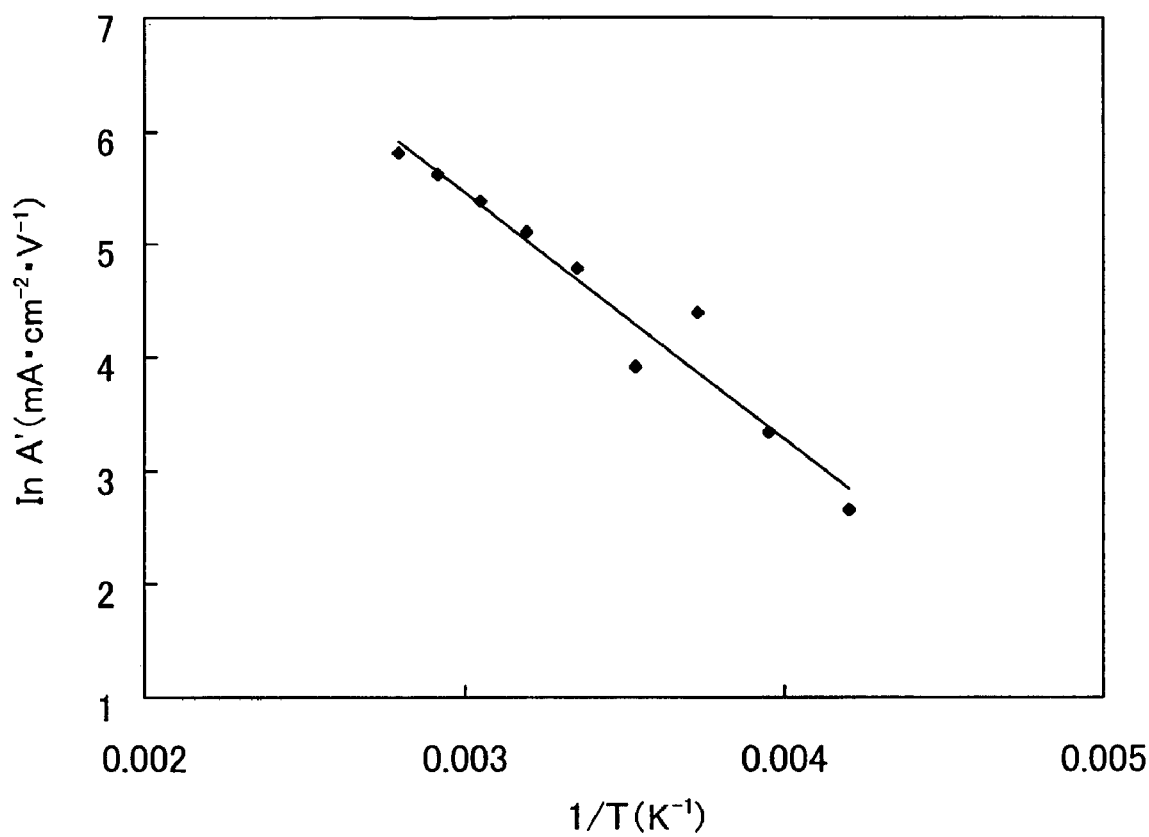
FIG. 27 shows an Arrhenius plot when current-voltage characteristics of a composite material of the present invention are assumed to follow Formula (1).

A result of making an Arrhenius plot of A' is shown in FIG. 27. Since the Arrhenius plot shows linearity as shown in FIG. 27, it is found that an ohmic contact is formed as to hole injection from ITSO into the composite material of the invention and a current amount thereof follows Formula (1). Note that activation energy $\phi_a$ at this time is 0.37 eV.

Since almost the same amount of current as that under forward bias also flows under reverse bias, it is found that an ohmic contact is formed as to hole injection from Al into the composite material of the invention and a current amount thereof follows Formula (1).

Note that a work function of ITSO is 4.89 eV and that of Al is approximately 4 eV (each of which is measured using a photoelectron spectrometer AC-2 (manufactured by Riken Keiki Co., Ltd.)). According to the above, it is found that measured current-voltage characteristics of the composite material of the invention sandwiched between electrodes each having a work function of 3.5 eV to 5.5 eV follow Formula (1).

In addition, following Formula (1) allows the composite material of the invention to have an ohmic with the electrode and in addition, to conduct a large amount of current. Thus, a light emitting element in which the composite material of the invention is provided in contact with the electrode can reduce a drive voltage. In addition, general-purpose metal such as aluminum can be used for an anode.

The invention claimed is:

1. A light emitting element comprising a first layer and a third layer and a second layer containing a light emitting material between a first electrode and a second electrode,
   wherein the first layer is provided in contact with the first electrode, and the first layer is formed from a composite material comprising organic compounds and an inorganic compound,
   wherein the first electrode forms an ohmic contact with the first layer,
   wherein the composite material is to have both band conduction using carrier generation by adding an electron-accepting material to the organic compound and hopping conduction between organic compounds when the organic compound transports carriers injected from outside,
   wherein the third layer is between the first layer and the second layer,
   wherein the organic compounds are an aromatic amine compound and rubrene,
   wherein the inorganic compound is a molybdenum oxide, and
   wherein the first electrode is an indium tin oxide layer to which silicon is added.

2. A light emitting element according to claim 1, wherein the first electrode is an anode.

3. A light emitting element according to claim 1, wherein the first electrode contains a material having a work function of 3.5 eV to 5.5 eV.

4. A light emitting device comprising the light emitting element according to claim 1.

5. A light emitting device according to claim 1, wherein the organic compound has a hole-transporting property.

6. A light emitting device according to claim 1, wherein the third layer includes an electron transporting organic compound and a material showing an electron donating property to the organic compound.

7. A light emitting device according to claim 1, wherein a measured current-voltage characteristic of a thin-film layer formed from the composite material follows Formula (1);

$$J = \left\{A\exp\left(\frac{-\phi_a}{2kT}\right)\right\}V + BV^n \quad (1)$$

wherein J denotes a current density; V, a voltage; $\phi_a$, activation energy for carrier generation in the composite material; k, Boltzmann constant; T, a temperature; A and B are constants determined by a distance between the pair of electrodes d, the amount of elementary charge q, a mobility μ determined by the kind of the composite material, a dielectric constant ∈, the number of traps per unit volume Nt, the number of LUMO levels per volume of the organic compound in the composite material $N_{LUMO}$; and n, an integer of 2 to 10.

8. A light emitting device according to claim 1, wherein the aromatic amine compound is selected from the group consisting of 4,4',4"-tris(N,N-diphenylamino)triphenylamine, 4,4',4"-tris[N-(3-methylphenyl)-N-phenylamino]triphenylamine, 1,3,5-tris[N,N-di(m-tolyl)amino]benzene, N,N'-diphenyl-N,N"-bis(3-methylphenyl)-1,1'-biphenyl-4,4'-diamine, 4,4'-bis[N-(1-naphthyl)-N-phenylamino]biphenyl, 4,4'-bis{N-[4-di(m-tolyl)amino]phenyl-N-phenylamino}biphenyl, 4,4'-bis[N-(4-biphenylyl)-N-phenylamino]biphenyl, 4,4',4"-tri(N-carbazolyl)triphenylamine.

9. A light emitting device according to claim 1, wherein the light emitting material is selected from the group consisting of 9,10-di(2-naphthyl)anthracene, 2-tert-butyl-9,10-di(2-naphthyl)anthracene, 4,4'-bis(2,2-diphenylvinyl)biphenyl, Coumarin 30, Coumarin 6, Coumarin 545, Coumarin 545T, perylene, rubrene, periflanthene, 2,5,8,11-tetra(tert-butyl) perylene, 9,10-diphenylanthracene, 5,12-diphenyltetracene, 4-(dicyanomethylene)-2-methyl-6-[p-(dimethylamino) styryl]-4H-pyran, 4-(dicyanomethylene)-2-methyl-6-[2-(julolidine-9-yl)ethenyl]-4H-pyran, 4-(dicyanomethylene)-2,6-bis[p-(dimethylamino)styryl]-4H-pyran.

10. A light emitting element according to claim 1, wherein the second electrode contains a material having a work function of 3.5 eV to 5.5 eV.

11. A light emitting device according to claim 1, wherein the third layer is selected from the group consisting of tris(8-quinolinolato)aluminum, tris(4-methyl-8-quinolinolato)aluminum, bis(10-hydroxybenzo[h]-quinolinato)beryllium, bis(2-methyl-8-quinolinolato)(4-phenylphenolato)aluminum, bis[2-(2'-hydroxyphenyl)benzoxazolato]zinc, bis[2-(2'-hydroxyphenyl)benzothiazolato]zinc, bathophenanthroline, bathocuproin, 2-(4-biphenylyl)-5-(4-tert-butylphenyl)-1,3,4-oxadiazole, 1,3-bis[5-(4-tert-butylphenyl)-1,3,4-oxadiazole-2-yl]benzene, 2,2',2"-(1,3,5-benzenetriyl)-tris(1-phenyl-1H-benzimidazole), 3-(4-biphenylyl)-4-phenyl-5-(4-tert-butylphenyl)-1,2,4-triazole, 3-(4-biphenylyl)-4-(4-ethylphenyl)-5-(4-tert-butylphenyl)-1,2,4-triazole.

12. A light emitting element comprising a first layer and a third layer and a second layer containing a light emitting material between a first electrode and a second electrode, wherein the first layer is provided in contact with the first electrode, and the first layer is formed from a composite material comprising organic compounds and an inorganic compound, wherein the composite material is to have both band conduction using carrier generation by adding an electron-accepting material to the organic compound and hopping conduction between organic compounds when the organic compound transports carriers injected from outside, wherein the third layer is between the first layer and the second layer, wherein the organic compounds are 4,4'-bis[N-(1-naphthyl)-N-phenylamino]biphenyl and rubrene, wherein the inorganic compound is a molybdenum oxide, and wherein the first electrode contains a material having a work function of 3.5 eV to 5.5 eV.

13. A light emitting element according to claim 12, wherein the second electrode contains a material having a work function of 3.5 eV to 5.5 eV.

14. A light emitting element comprising a first layer and a third layer and a second layer containing a light emitting material between a first electrode and a second electrode, wherein the first layer is provided in contact with the first electrode, and the first layer is formed from a composite material comprising organic compounds and an inorganic compound, wherein the composite material is to have both band conduction using carrier generation by adding an electron-accepting material to the organic compound and hopping conduction between organic compounds when the organic compound transports carriers injected from outside, wherein the third layer is between the first layer and the second layer, wherein the organic compounds are 4,4'-bis[N-(4-biphenylyl)-N-phenylamino]biphenyl and rubrene, wherein the inorganic compound is a molybdenum oxide, and wherein the first electrode contains a material having a work function of 3.5 eV to 5.5 eV.

15. A light emitting element according to claim 14, wherein the second electrode contains a material having a work function of 3.5 eV to 5.5 eV.

* * * * *